United States Patent
Osada et al.

(10) Patent No.: US 6,885,057 B2
(45) Date of Patent: Apr. 26, 2005

(54) SEMICONDUCTOR INTEGRATED CIRCUIT DEVICE WITH REDUCED LEAKAGE CURRENT

(75) Inventors: Kenichi Osada, Kawasaki (JP); Koichiro Ishibashi, Warabi (JP); Yoshikazu Saitoh, Hamura (JP); Akio Nishida, Tachikawa (JP); Masaru Nakamichi, Hitachinaka (JP); Naoki Kitai, Fussa (JP)

(73) Assignees: Renesas Technology Corp., Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 10/158,903

(22) Filed: Jun. 3, 2002

(65) Prior Publication Data

US 2002/0179940 A1 Dec. 5, 2002

(30) Foreign Application Priority Data

Jun. 5, 2001 (JP) .................................. 2001-168945
Jan. 28, 2002 (JP) .................................. 2002-017840

(51) Int. Cl.$^7$ ......................................... H01L 29/788
(52) U.S. Cl. ................. 257/316; 257/320; 257/321; 438/241; 438/258
(58) Field of Search ........................ 257/314–316, 257/320–321; 438/241, 258, 266

(56) References Cited

U.S. PATENT DOCUMENTS 6,307,236 B1    10/2001  Matsuzaki et al.
2001/0017798 A1 * 8/2001  Ishii ........................... 365/200

FOREIGN PATENT DOCUMENTS

JP    9-135029    9/1996
JP    2000-357962  9/1999

* cited by examiner

Primary Examiner—Hsien-Ming Lee
(74) Attorney, Agent, or Firm—Reed Smith LLP; Stanley P. Fisher, Esq.; Juan Carlos A. Marquez, Esq.

(57) ABSTRACT

The gate tunnel leakage current is increased in the up-to-date process, so that it is necessary to reduce the gate tunnel leakage current in the LSI which is driven by a battery for use in a cellular phone and which needs to be in a standby mode at a low leakage current. In a semiconductor integrated circuit device, the ground source electrode lines of logic and memory circuits are kept at a ground potential in an active mode, and are kept at a voltage higher than the ground potential in an unselected standby mode. The gate tunnel leakage current can be reduced without destroying data.

8 Claims, 16 Drawing Sheets

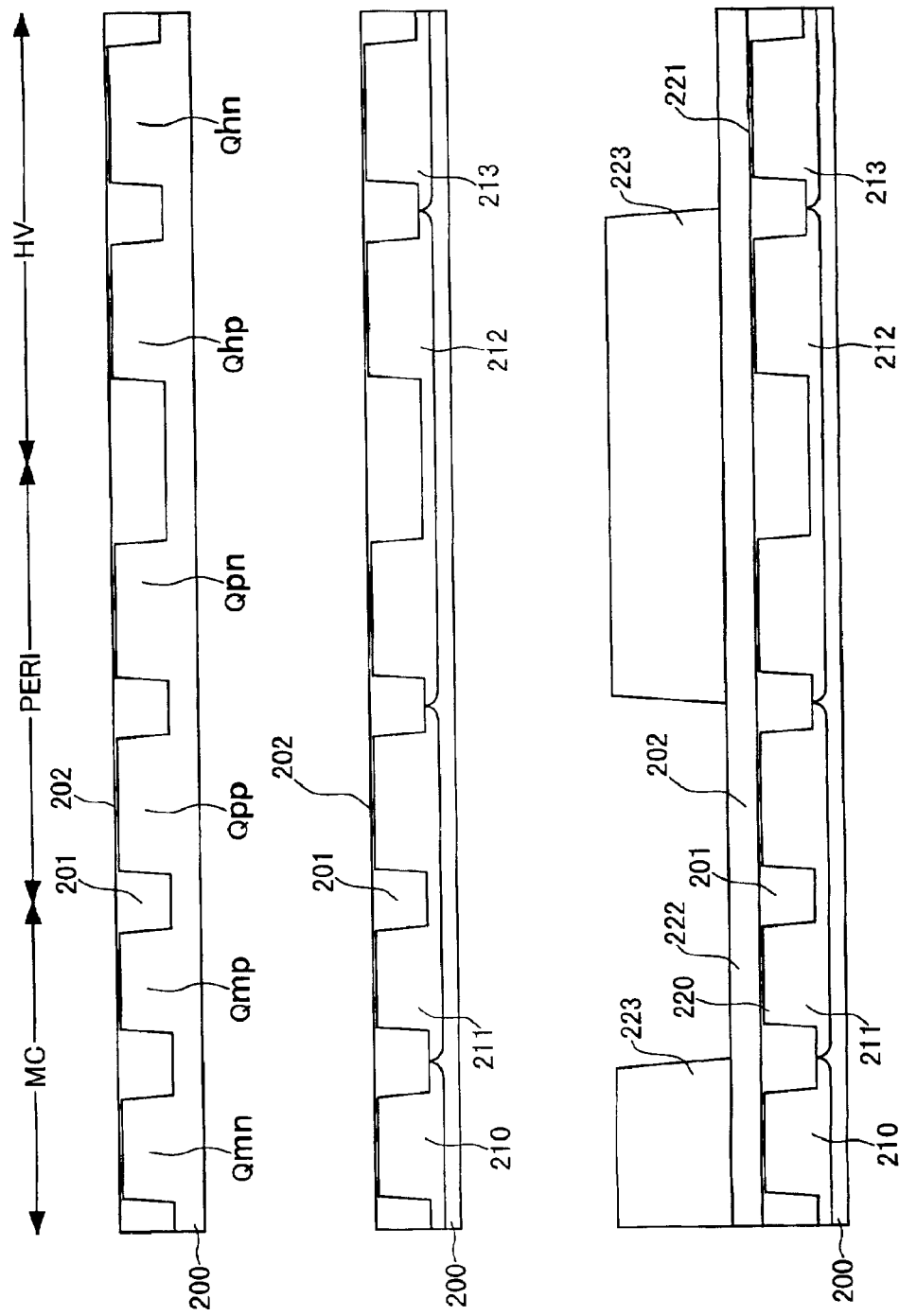

SEMICONDUCTOR INTEGRATED CIRCUIT DEVICE WITH REDUCED LEAKAGE CURRENT

BACKGROUND OF THE INVENTION

The present invention relates to a semiconductor integrated circuit device and manufacturing method of the device, particularly to a static random access memory (SRAM), on-chip memory mounted on a system LSI, microprocessor, system LSI, and the like.

As a known technique for reducing a gate tunnel leakage current, U.S. Pat. No. 6,307,236 is known. In the known example, when the gate tunnel leakage current is large, a power is cut off with a switch MOS having a thick gate oxide layer and small gate tunnel leakage current, and thereby the leakage current is reduced in a disclosed circuit. Moreover, as a technique for reducing a gate induced drain leakage (GIDL) current, JP-A-2000-357962 is known. In the known example, on the assumption that a MOS transistor has a relatively small threshold value, in order to reduce a sub-threshold leakage current, a substrate electrode of a P channel type MOS transistor is first controlled to be not less than a power voltage, and the substrate electrode of an N channel type MOS transistor is controlled to be not more than a ground potential. As a result, GIDL is actually generated. To solve the problem, a technique of reducing the power voltage to reduce the GIDL current is disclosed. Moreover, in JPA-9-135029, as a GIDL current countermeasure, a technique of implanting phosphorus ions in a gate electrode and source/drain region of an N channel MIS transistor is disclosed.

In recent years, with miniaturization of a process, the MOS transistor has had a gate oxide layer thickness of 4 nm or less. However, when the thickness of the gate oxide layer is 4 nm or less, the gate tunnel leakage current increases. When an activating voltage is supplied between gate and source electrodes, the gate tunnel leakage current is $10^{-12}$ A/$\mu m^2$ or more in a typical process.

In an LSI for use in a cellular phone, there is a demand for standby in a low leakage current. Particularly, in a SRAM, it is necessary to retain data with a button battery for one week or more. When the process becomes worst and the oxide layer becomes thin, the gate tunnel leakage current increases and it is disadvantageously impossible to retain the data for one week or more. Moreover, an increase of the GIDL current as the leakage current flowing to a substrate from a drain similarly raises a problem. However, in the conventional known example (U.S. Pat. No. 6,307,236) for reducing the gate tunnel leakage current, the power is cut off with the MOS, and therefore there is a problem that data retained in a SRAM cell, register file, latch circuit, and the like are destroyed. Moreover, in the conventional known example (JP-A-2000-357962) for reducing the GIDL current, when the MOS transistor having a relatively high threshold value, for example, of 0.7 V is used, the subthreshold leakage current is not remarkable. Therefore, even when the substrate electrode of the N channel type MOS transistor is set to a potential not more than the ground potential and the substrate electrode of the P channel type MOS transistor is set to a potential not less than the power voltage, an off leakage current is not reduced, and all the more a junction leak current disadvantageously increases.

SUMMARY OF THE INVENTION

A summary of a typical invention in inventions disclosed in the present application will briefly be described hereinafter.

According to an aspect of the present invention, there is disclosed a semiconductor integrated circuit device comprising: at least one logic circuit including a first current path having at least one N channel type MOS transistor and a second current path having at least one P channel type MOS transistor, wherein terminals of the current paths of the logic circuit are connected to each other; and when one current path is in a conductive condition, the other current path is in a non conductive condition. In the at least one logic circuit, the other terminal of the first current path is connected via a source line, the source line is connected to a switch circuit, and the switch circuit keeps the source line at a ground potential, when the at least one logic circuit is selected to operate, and keeps the source line at a voltage higher than the ground potential, when the logic circuit is not selected and is in a standby condition.

A substrate electrode of the N channel type MOS transistor is connected to the ground potential or the source line.

In the standby condition, the voltage supplied between gate and source electrodes of the MOS transistor in an ON-state is smaller than a power voltage. Therefore, the gate tunnel leakage current can be reduced, and retained data of a latch or the like is not destroyed.

Moreover, in the MOS transistor whose subthreshold current is smaller than GIDL, and whose threshold value is high, the voltage supplied between the gate and drain electrodes in an OFF-state is smaller than the power voltage, GIDL is reduced and an off current is reduced. However, since the ground potential or a voltage higher than the ground potential is supplied to the substrate electrode of the N channel type MOS transistor and the power voltage is supplied to the substrate electrode of the P channel type MOS transistor, a junction leak current does not increase.

FIG. 13 shows a dependence of current Ids between the drain and source of the N channel type MOS transistor on a gate voltage, whose threshold voltage is relatively high as about 0.7 V and whose subthreshold current is smaller than the GIDL current. The current Ids is shown in a logarithmic scale. A case in which a drain voltage is set to the power voltage (1.5 V) and a case in which the drain voltage is set to a potential (1.0 V) lower than the power voltage according to the present invention are shown. The source electrode and substrate electrode are connected to the ground potential, and the substrate potential is not biased. Since a potential difference supplied between the gate and drain drops and the GIDL current is reduced in the OFF-state, the leakage current can be reduced.

Moreover, according to the present invention, there is provided a semiconductor device comprising: an N channel type MOS transistor in which arsenic is used in a region to make a contact and phosphorus is used in an extension region, in a source/drain region. In the semiconductor device having the SRAM, the N channel type MOS transistor is used as an N channel type MOS transistor in a memory cell of an SRAM, and the N channel type MOS transistor, in which arsenic is used both in the region to make the contact and the extension region, is used as an N channel type MOS transistor of a peripheral circuit to control the memory cell.

Other objects, features and advantages of the invention will become apparent from the following description of the embodiments of the invention taken in conjunction with the accompanying drawings.

BRIEF DESCRIPTION OF THE DRAWINGS

FIGS. 17A–17C are main part sectional views of a semiconductor substrate showing a manufacturing method of a semiconductor integrated circuit of the present invention;

DETAILED DESCRIPTION OF THE EMBODIMENTS

Several preferred examples of a semiconductor memory device according to the present invention will be described hereinafter with reference to the drawings.

<First Embodiment>

Figure 1:
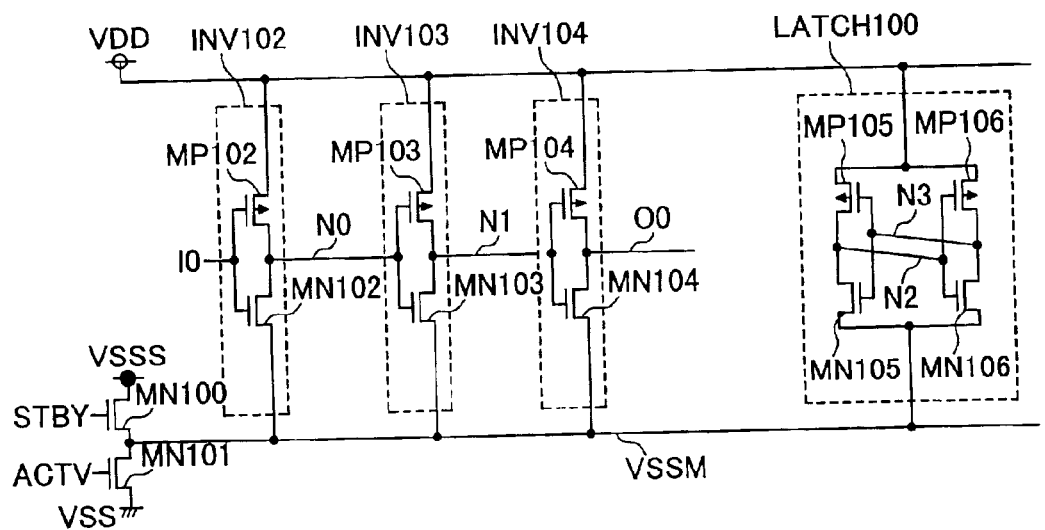
FIG. 1 is a circuit diagram of a semiconductor device integrated circuit according to a first embodiment.

FIG. 1 is a circuit diagram showing one embodiment of a semiconductor device according to the present invention. The present circuit shows a part of a semiconductor integrated circuit constituted of a P channel type MOS transistor MP and N channel type MOS transistor MN. The circuit is formed on a semiconductor substrate such as single crystal silicon using a semiconductor integrated circuit manufacturing technique in which an insulating layer for use in a gate of the MOS transistor has a thickness of 4 nm or less, and a gate tunnel leakage current is $10^{-12}$ A/$\mu$m$^2$ or more at a power voltage of 1.5 V.

FIG. 1 shows an inverter circuit INV and a latch circuit LATCH which retains data, as a part of a semiconductor integrated circuit device.

An inverter circuit INV102 is constituted of a P channel type MOS transistor MP102 and N channel type MOS transistor MN102. A gate electrode of the P channel type MOS transistor MP102 is connected to an input signal I0, a drain electrode thereof is connected to a connection node N0, and a source electrode thereof is connected to a power voltage VDD. Moreover, the substrate electrode of the P channel type MOS transistor MP102 is connected to the power voltage VDD. The gate electrode of the N channel type MOS transistor MN102 is connected to the input signal I0, the drain electrode thereof is connected to the connection node N0, and the source electrode thereof is connected to a ground source electrode line VSSM. Moreover, the substrate electrode of the N channel type MOS transistor MN102 is connected to the ground source electrode line VSSM or a ground potential VSS.

An inverter circuit INV103 is constituted of a P channel type MOS transistor MP103 and N channel type MOS transistor MN103. The gate electrode of the P channel type MOS transistor MP103 is connected to the connection node N0, the drain electrode thereof is connected to a connection node N1, and the source electrode thereof is connected to the power voltage VDD. Moreover, the substrate electrode of the P channel type MOS transistor MP103 is connected to the power voltage VDD. The gate electrode of the N channel type MOS transistor MN103 is connected to the connection node N0, the drain electrode thereof is connected to the connection node N1, and the source electrode thereof is connected to the ground source electrode line VSSM. Moreover, the substrate electrode of the N channel type MOS transistor MN103 is connected to the ground source electrode line VSSM or the ground potential VSS.

An inverter circuit INV104 is constituted of a P channel type MOS transistor MP104 and N channel type MOS transistor MN104. The gate electrode of the P channel type MOS transistor MP104 is connected to the connection node N1, the drain electrode thereof is connected to an output node O0, and the source electrode thereof is connected to the power voltage VDD. Moreover, the substrate electrode of the P channel type MOS transistor MP104 is connected to the power voltage VDD. The gate electrode of the N channel type MOS transistor MN104 is connected to the connection node N1, the drain electrode thereof is connected to the output node O0, and the source electrode thereof is connected to the ground source electrode line VSSM. Moreover, the substrate electrode of the N channel type MOS transistor MN104 is connected to the ground source electrode line VSSM or the ground potential VSS.

The latch circuit LATCH is constituted of a flip-flop constituted by connecting an input and output of a CMOS inverter (constituted of P channel type MOS transistors (MP105, MP106), and N channel type MOS transistors (MN105, MN106)), and information is stored in storage nodes N2 and N3.

The gate electrode of the P channel type MOS transistor MP105 is connected to the storage node N3, the drain electrode thereof is connected to the storage node N2, and the source electrode thereof is connected to the power voltage VDD. Moreover, the substrate electrode of the P channel type MOS transistor MP105 is connected to the power voltage VDD.

The gate electrode of the P channel type MOS transistor MP106 is connected to the storage node N2, the drain electrode thereof is connected to the storage node N3, and the source electrode thereof is connected to the power voltage VDD. Moreover, the substrate electrode of the P channel type MOS transistor MP106 is connected to the power voltage VDD.

The gate electrode of the N channel type MOS transistor MN105 is connected to the storage node N3, the drain electrode thereof is connected to the storage node N2, and the source electrode thereof is connected to the ground source electrode line VSSM. Moreover, the substrate electrode of the N channel type MOS transistor MN105 is connected to the ground source electrode line VSSM or the ground potential VSS.

The gate electrode of the N channel type MOS transistor MN106 is connected to the storage node N2, the drain electrode thereof is connected to the storage node N3, and the source electrode thereof is connected to the ground source electrode line VSSM. Moreover, the substrate electrode of the N channel type MOS transistor MN106 is connected to the ground source electrode line VSSM or the ground potential VSS.

Moreover, the N channel type MOS transistor MN101 which connects the ground source electrode line VSSM to the ground potential VSS, and an N channel type MOS transistor MN100 which connects the ground source electrode line VSSM to the potential VSSS higher than the ground potential, for example, 0.5 V are disposed.

Figure 2:
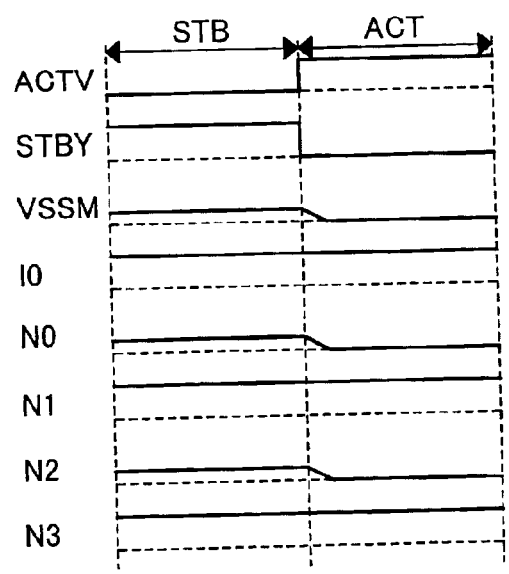
FIG. 2 shows an operating waveform of the semiconductor device integrated circuit according to the first embodiment.

An active mode and standby mode will next be described using an operating waveform shown in FIG. 2.

Here, the power voltage VDD is set to 1.5 V, the ground potential VSS is set to 0 V, and the potential VSSS higher than the ground potential is set to 0.5 V. The voltage is changed by properties of the device, and the like.

In the active mode, the N channel type MOS transistor MN101 is on, and VSSM corresponds to the ground potential VSS, for example, 0 V. The potential of I0, N1 and N3 is 1.5 V, and the potential of N0 and N2 is 0 V. In this case, the P channel type MOS transistors (MP103 and MP106) and N channel type MOS transistors (MN102, MN104 and MN105) are on, and the P channel type MOS transistors (MP102, MP104 and MP105) and N channel type MOS transistors (MN103 and MN106) are off.

A voltage of 1.5 V is supplied between the gate and source electrodes of the P channel type MOS transistor MP103, and thereby a gate tunnel leakage current flows from the source electrode to the gate electrode. The current flows to the ground potential VSS through the connection node N0 and the N channel type MOS transistor MN102 in the ON-state.

Similarly, a voltage of 1.5 V is supplied between the gate and source electrodes of the N channel type MOS transistor MN104 and the gate tunnel leakage current flows from the gate electrode to the source electrode. The current flows from the power voltage VDD through the connection node N1 and the P channel type MOS transistor MP103 in the ON-state.

Similarly, a voltage of 1.5 V is supplied between the gate and source electrodes of the P channel type MOS transistor MP106, and thereby the gate tunnel leakage current flows to the gate electrode from the source electrode. The current flows to the ground potential VSS through the connection node N2, and the N channel type MOS transistor MN105 in the ON-state.

Similarly, a voltage of 1.5 V is supplied between the gate and source electrodes of the N channel type MOS transistor MN105, and thereby the gate tunnel leakage current flows from the gate electrode to the source electrode. The current flows from the power voltage VDD through the connection node N2 and the P channel type MOS transistor MP106 in the ON-state.

The gate tunnel leakage current flows via the above-described path in the active mode.

On the other hand, in the standby mode, the N channel type MOS transistor MN100 is on, and VSSM corresponds to the potential VSSS higher than the ground potential, for example, 0.5 V. The potential of I0, N1 and N3 is 1.5 V, and the potential of N0 and N2 is 0.5 V. In this case, the P channel type MOS transistors (MP103 and MP106) and N channel type MOS transistors (MN102, MN104 and MN105) are on, and the P channel type MOS transistors (MP102, MP104 and MP105) and N channel type MOS transistors (MN103 and MN106) are off.

A voltage of 1.0 V is supplied between the gate and source electrodes of the P channel type MOS transistor MP103, and thereby the gate tunnel leakage current is reduced by about one digit as compared with when the potential difference of 1.5 V is supplied.

Similarly, a voltage of 1.0 V is supplied between the gate and source electrodes of the N channel type MOS transistor MN104, and thereby the gate tunnel leakage current is reduced by about one digit as compared with when the potential difference of 1.5 V is supplied.

Similarly, a voltage of 1.0 V is supplied between the gate and source electrodes of the P channel type MOS transistor MP106, and thereby the gate tunnel leakage current is reduced by about one digit as compared with when the potential difference of 1.5 V is supplied.

Similarly, a voltage of 1.0 V is supplied between the gate and the source electrodes of the N channel type MOS transistor MN105, and thereby the gate tunnel leakage current is reduced by about one digit as compared with when the potential difference of 1.5 V is supplied.

Since the voltage supplied between the gate and source drops as described above, the gate tunnel leakage current decreases. On the other hand, the retained data is not destroyed. Moreover, since the voltage supplied between the gate and the drain in the OFF-state drops, the GIDL current also decreases.

In the present embodiment, the inverter circuit and the latch circuit have been described, but similar effects are obtained even in other semiconductor integrated circuits such as a NAND circuit and NOR circuit.

<Second Embodiment>

Figure 3:
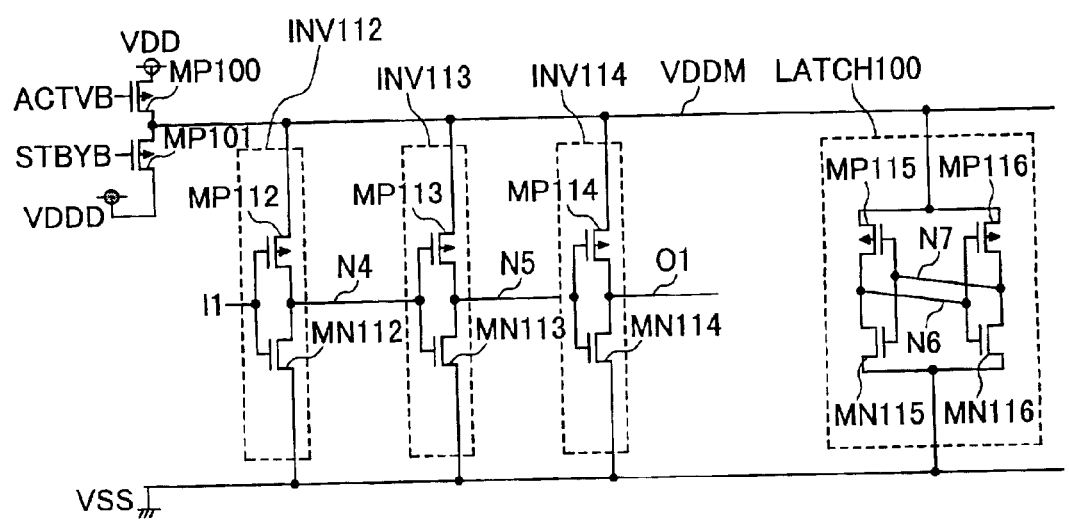
FIG. 3 is a circuit diagram of the semiconductor device integrated circuit according to a second embodiment.

FIG. 3 is a circuit diagram showing one embodiment of the semiconductor device according to the present invention. The present circuit shows a part of the semiconductor integrated circuit constituted of the P channel type MOS transistor MP and N channel type MOS transistor MN. The circuit is formed on the semiconductor substrate such as single crystal silicon using the semiconductor integrated circuit manufacturing technique in which the insulating layer for use in the gate of the MOS transistor has a thickness of 4 nm or less, and the tunnel leakage current is $10^{-12}$ A/$\mu m^2$ or more at the power voltage of 1.5 V.

FIG. 3 shows the inverter circuit INV and the latch circuit LATCH which retains data, as a part of the semiconductor integrated circuit device.

An inverter circuit INV112 is constituted of a P channel type MOS transistor MP112 and N channel type MOS transistor MN112. The gate electrode of the P channel type MOS transistor MP112 is connected to an input signal I1, the drain electrode thereof is connected to a connection node N4, and the source electrode thereof is connected to a power source electrode line VDDM. Moreover, the substrate electrode of the P channel type MOS transistor MP112 is connected to the power source electrode line VDDM or the power voltage VDD. The gate electrode of the N channel type MOS transistor MN112 is connected to the input signal I1, the drain electrode thereof is connected to the connection node N4, and the source electrode thereof is connected to the ground potential VSS. Moreover, the substrate electrode of the N channel type MOS transistor MN112 is connected to the ground potential VSS.

An inverter circuit INV113 is constituted of a P channel type MOS transistor MP113 and N channel type MOS transistor MN113. The gate electrode of the P channel type MOS transistor MP113 is connected to the connection node N4, the drain electrode thereof is connected to a connection node N5, and the source electrode thereof is connected to the power source electrode line VDDM. Moreover, the substrate electrode of the P channel type MOS transistor MP113 is connected to the power source electrode line VDDM or the power voltage VDD. The gate electrode of the N channel type MOS transistor MN113 is connected to the connection node N4, the drain electrode thereof is connected to the connection node N5, and the source electrode thereof is connected to the ground potential VSS. Moreover, the substrate electrode of the N channel type MOS transistor MN114 is connected to the ground potential VSS.

An inverter circuit INV114 is constituted of a P channel type MOS transistor MP114 and N channel type MOS transistor MN114. The gate electrode of the P channel type MOS transistor MP114 is connected to the connection node N5, the drain electrode thereof is connected to an output signal O1, and the source electrode thereof is connected to the power source electrode line VDDM. Moreover, the substrate electrode of the P channel type MOS transistor MP114 is connected to the power source electrode line VDDM or the power voltage VDD. The gate electrode of the N channel type MOS transistor MN114 is connected to the connection node N5, the drain electrode thereof is connected to the output signal O1, and the source electrode thereof is connected to the ground potential VSS. Moreover, the substrate electrode of the N channel type MOS transistor MN114 is connected to the ground potential VSS.

The latch circuit LATCH is constituted of the flip-flop constituted by connecting the input and output of the CMOS inverter (constituted of P channel type MOS transistors (MP115 and MP116) and N channel type MOS transistors (MN115 and MN116)), and the information is stored in storage nodes N6 and N7.

The gate electrode of the P channel type MOS transistor MP115 is connected to the storage node N7, the drain electrode thereof is connected to the storage node N6, and the source electrode thereof is connected to the power source electrode line VDDM. Moreover, the substrate electrode of the P channel type MOS transistor MP115 is connected to the power source electrode line VDDM or the power voltage VDD.

The gate electrode of the P channel type MOS transistor MP116 is connected to the storage node N6, the drain electrode thereof is connected to the storage node N7, and the source electrode thereof is connected to the power source electrode line VDDM. Moreover, the substrate electrode of the P channel type MOS transistor MP116 is connected to the power source electrode line VDDM or the power voltage VDD.

The gate electrode of the N channel type MOS transistor MN115 is connected to the storage node N7, the drain electrode thereof is connected to the storage node N6, and the source electrode thereof is connected to the ground potential VSS. Moreover, the substrate electrode of the N channel type MOS transistor MN115 is connected to the ground potential VSS.

The gate electrode of the N channel type MOS transistor MN116 is connected to the storage node N6, the drain electrode thereof is connected to the storage node N7, and the source electrode thereof is connected to the ground potential VSS. Moreover, the substrate electrode of the N channel type MOS transistor MN116 is connected to the ground potential VSS.

Moreover, a P channel type MOS transistor MP101 which connects the ground source electrode line VDDM to the ground potential VDD, and a P channel type MOS transistor MP100 which connects a ground source electrode line VDDM to a potential VDDD higher than the power voltage, for example, 1.0 V are disposed.

Figure 4:
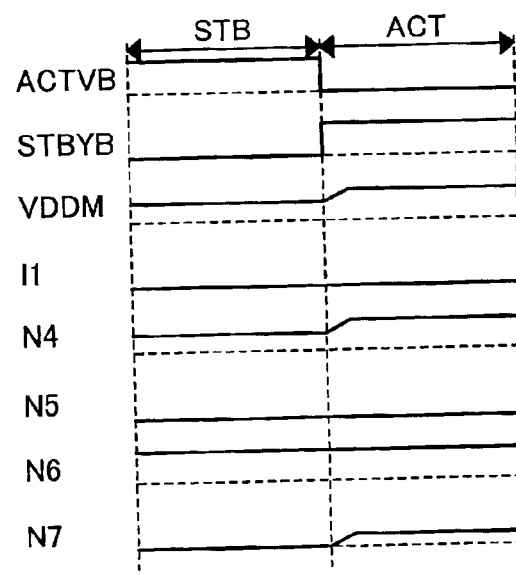
FIG. 4 shows the operating waveform of the semiconductor device integrated circuit according to the second embodiment.

The active and standby modes will next be described using an operating waveform shown in FIG. 4.

Here, the power voltage VDD is set to 1.5 V, ground potential VSS is set to 0 V, and potential VDDD lower than the power voltage is set to 1.0 V. The voltage is changed by properties of the device, and the like.

In the active mode, the N channel type MOS transistor MN100 is on, and VDDM corresponds to the power voltage VDD, for example, 1.5 V. The potential of N4 and N7 is 1.5 V, and the potential of I1, N5 and N6 is 0 V. In this case, the P channel type MOS transistors (MP112, MP114 and MP116) and N channel type MOS transistors (MN113 and MN115) are on, and the P channel type MOS transistors (MP113 and MP115) and N channel type MOS transistors (MN112, MN114 and MN116) are off.

A voltage of 1.5 V is supplied between the gate and source electrodes of the N channel type MOS transistor MN113, and thereby the gate tunnel leakage current flows from the gate electrode to the source electrode. The current flows from the power voltage VDD through the connection node N4 and the P channel type MOS transistor MP112 in the ON-state.

Similarly, a voltage of 1.5 V is supplied between the gate and source electrodes of the P channel type MOS transistor MP114, and thereby the gate tunnel leakage current flows from the source electrode to the gate electrode. The current flows to the ground potential VSS through the connection node N5 and the N channel type MOS transistor MN113 in the ON-state.

Similarly, a voltage of 1.5 V is supplied between the gate and source electrodes of the P channel type MOS transistor MP116, and thereby the gate tunnel leakage current flows from the source electrode to the gate electrode. The current flows to the ground potential VSS through the connection node N6 and the N channel type MOS transistor MN115 in the ON-state.

Similarly, a voltage of 1.5 V is supplied between the gate and source electrodes of the N channel type MOS transistor MN115, and thereby the gate tunnel leakage current flows from the gate electrode to the source electrode. The current flows from the power voltage VDD through the connection node N6 and the P channel type MOS transistor MP116 in the ON-state.

The gate tunnel leakage current flows via the above-described path in the active mode.

On the other hand, in the standby mode, the P channel type MOS transistor MP101 is on, and VDDM corresponds to a potential VVDD lower than the power voltage, for example, 1.0 V. The potential of N4 and N7 is 1.0 V, and the potential of I1, N5 and N6 is 0 V. In this case, the P channel type MOS transistors (MP112, MP114 and MP116) and N channel type MOS transistors (MN113 and MN115) are on, and the P channel type MOS transistors (MP113 and MP115) and N channel type MOS transistors (MN112, MN114 and MN116) are off.

A voltage of 1.0 V is supplied between the gate and source electrodes of the N channel type MOS transistor MN113, and thereby the gate tunnel leakage current is reduced by about one digit as compared with when the potential difference of 1.5 V is supplied.

Similarly, a voltage of 1.0 V is supplied between the gate and source electrodes of the P channel type MOS transistor MP114, and thereby the gate tunnel leakage current is reduced by about one digit as compared with when the potential difference of 1.5 V is supplied.

Similarly, a voltage of 1.0 V is supplied between the gate and source electrodes of the P channel type MOS transistor MP116, and thereby the gate tunnel leakage current is reduced by about one digit as compared with when the potential difference of 1.5 V is supplied.

Similarly, a voltage of 1.0 V is supplied between the gate and source electrodes of the N channel type MOS transistor MN115, and thereby the gate tunnel leakage current is reduced by about one digit as compared with when the potential difference of 1.5 V is supplied.

Since the voltage supplied between the gate and the source drops as described above, the gate tunnel leakage current decreases. On the other hand, the retained data is not destroyed. Moreover, since the voltage supplied between the gate and the drain drops in the OFF-state, the GIDL current also decreases.

In the present embodiment, the inverter circuit and the latch circuit have been described, but similar effects are obtained even in the other semiconductor integrated circuit such as an NAND circuit or an NOR circuit.

<Third Embodiment>

Figure 15:
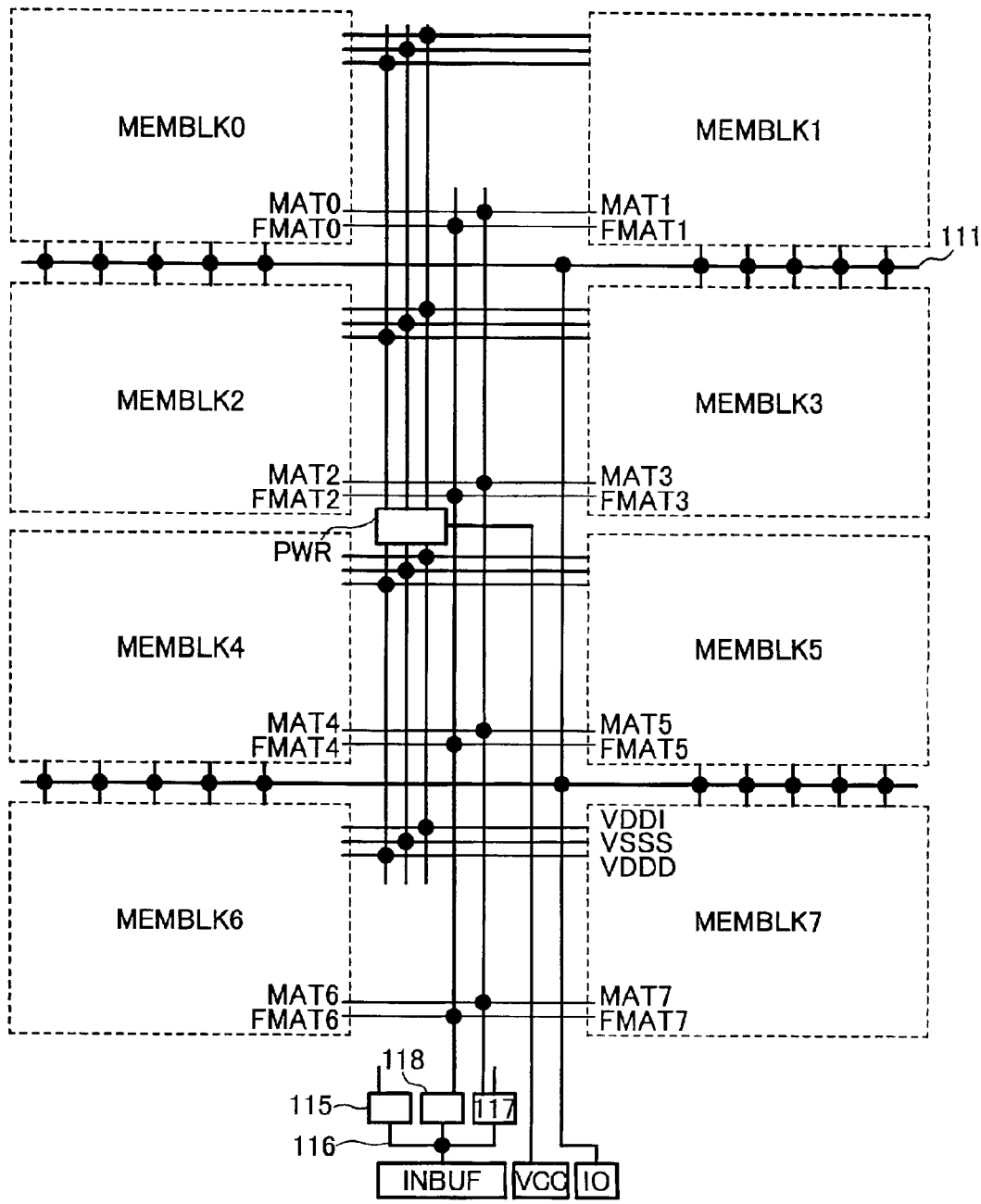
FIG. 15 is a schematic circuit diagram of the semiconductor memory device according to the third embodiment.

FIG. 15 is a circuit diagram showing one embodiment in which the present invention is applied to an SRAM. In a semiconductor manufacturing apparatus 98, the circuit constituted of the P channel type MOS transistor and N channel type MOS transistor is formed on the semiconductor substrate such as single crystal silicon using the semiconductor integrated circuit manufacturing technique in which the insulating layer for use in the gate of the MOS transistor has a thickness of 4 nm or less and the tunnel leakage current is $10^{-12}$ A/$\mu$m$^2$ or more at the power voltage of 1.5 V.

Figure 5:
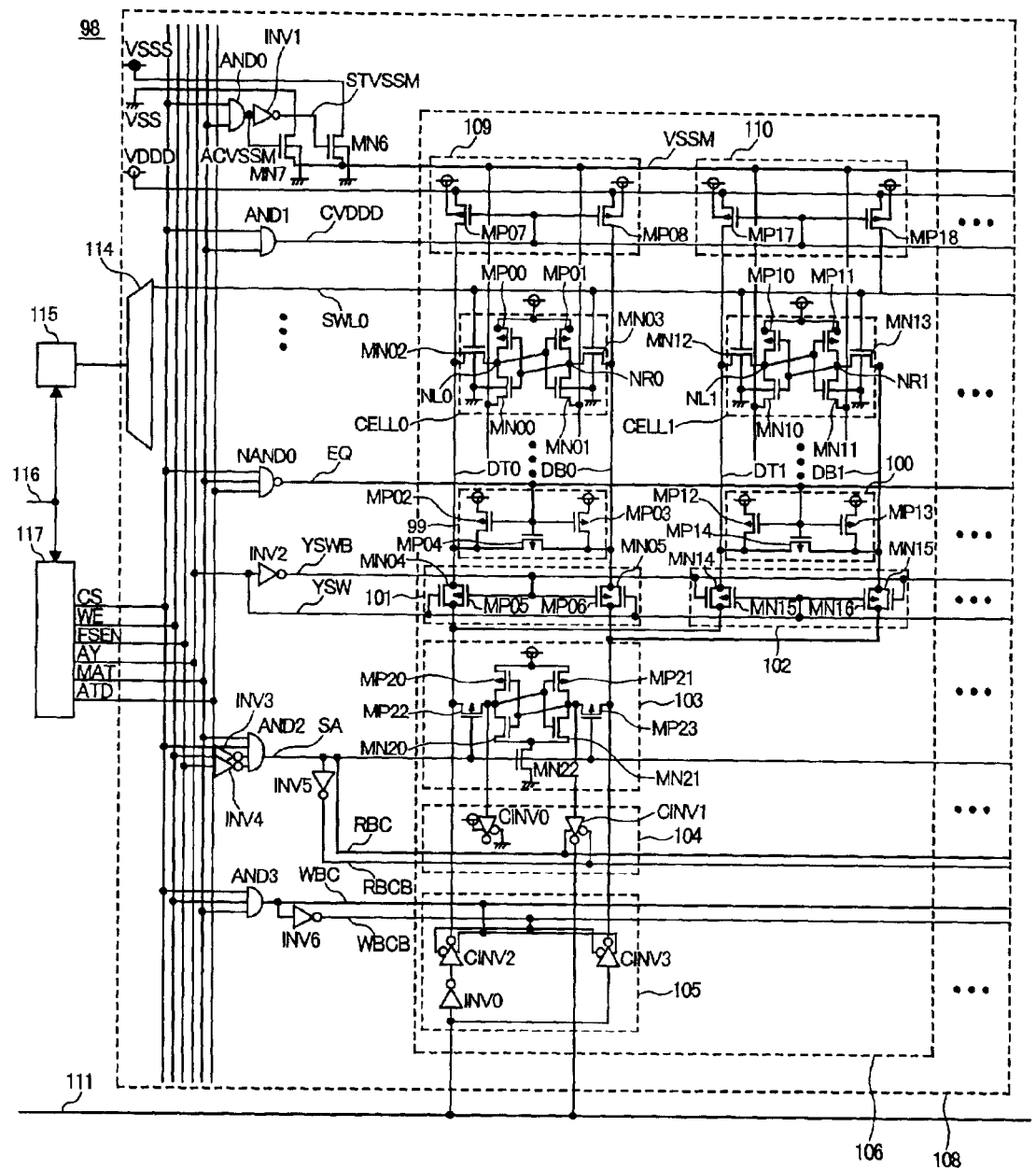
FIG. 5 is a circuit diagram of a semiconductor memory device according to a third embodiment.

The SRAM 98 as the semiconductor device is divided in a plurality of mats MEMBLK. Details of the mats are shown in FIG. 5. A mat unit is, for example, 2M bits, and the SRAM of 16 M is divided into eight mats. A voltage down converter PWR generates inner power supplies (VDD, VSSS and VDDD) based on a power voltage VCC supplied from an outer pad to distribute the supplies to the respective mats. Data 116 from an input buffer INBUF turns to a decode signal and a control signal through a predecoder 115 and a control circuit 117, and the signals are distributed to the respective mats. Each mat 108 is constituted of a plurality of base units 106. Each base unit is constituted of two columns of memory cells CELL.

A memory cell CELL0 is constituted of a flip-flop constituted by connecting the input and output of a pair of CMOS inverters (constituted of load P channel type MOS transistors (MO00 and MP01) and driver N channel type MOS transistors (MN00 and MN01)), and transfer N channel type MOS transistors (MN02 and MN03) which selectively connect storage nodes NL0 and NR0 of the flip-flop to data lines (DT0 and DB0). The gate electrodes of the N channel type MOS transistors (MN02 and MN03) are connected to a subword line SWL0.

A memory cell CELL1 is constituted of a flip-flop constituted by connecting the input and output of a pair of CMOS inverters (constituted of P channel type MOS transistors (MP10 and MP11) and N channel type MOS transistors (MN10 and MN11)), and N channel type MOS transistors (MN12 and MN13) which selectively connect storage nodes NL1 and NR1 of the flip-flop to data lines (DT1 and DB1). The gate electrodes of the N channel type MOS transistors (MN12 and MN13) are connected to the subword line SWL0.

Moreover, the base unit includes a sense amplifier circuit (103), a read data drive circuit (104), a write amplifier circuit (105), an equalizer/precharge circuits (99 and 100), and a Y switch circuits (101 and 102). The sense amplifier circuit (103) is constituted of a flip-flop constituted of P channel type MOS transistors (MP20 and MP21) and N channel type MOS transistors (MN20 and MN21), a latch sense amplifier circuit constituted of an N channel type MOS transistor MN22 which activates the sense amplifier, and switch circuits (MP22 and MP23). The gate electrodes of the MOS transistors (MN22, MP22 and MP23) are connected to an activating signal SA.

The Y switch circuit 101 includes P channel type MOS transistors (MP05 and MP06) and N channel type MOS transistors (MN04 and MN05) which connect the data lines (DT0 and DB0) to the sense amplifier circuit 103.

The Y switch circuit 102 includes P channel type MOS transistors (MP15 and MP16) and N channel type MOS transistors (MN14 and MN15) which connect the data lines (DT1 and DB1) to the sense amplifier circuit 103.

Control signals (YSW and YSWB) are signals for selecting whether the sense amplifier circuit 103 is connected to the data lines (DT0 and DB0) or the data lines (DT1 and DB1).

The write amplifier circuit 105 is constituted of two clocked inverters (CINV2 and CINV3) and an inverter INV0. A signal of a data bus 111 is propagated to the data lines by control signals (WBC and WBCB).

The read data drive circuit 104 is constituted of two clocked inverters (CINV2 and CINV3). Read data is propagated to the data bus 111 by control signals (RBC and RBCB).

The equalizer/precharge circuit 99 includes a P channel type MOS transistor MP02 which connects the power voltage VDD to the data line DT0, a P channel type MOS transistor MP03 which connects the power voltage VDD to the data line DB0, and a P channel type MOS transistor MP04 which connects the data line DT0 to the data line DB0. The gate electrodes of the P channel type MOS transistors (MP02, MP03 and MP04) are connected to a control signal EQ.

The equalizer/precharge circuit 100 includes a P channel type MOS transistor MP12 which connects the power voltage VDD to the data line DT1, a P channel type MOS transistor MP13 which connects the power voltage VDD to the data line DB1, and a P channel type MOS transistor MP14 which connects the data line DT1 to the data line DB1. The gate electrodes of the P channel type MOS transistors (MP12, MP13 and MP14) are connected to the control signal EQ.

Switch circuits (109 and 110) for supplying a voltage lower than the power voltage, for example, 1.0 V to the data lines (DT and DB) in the standby mode are disposed in the respective columns.

The switch circuit 109 is constituted of a P channel type MOS transistor MP07 for connecting a voltage VDDD lower than the power voltage to the data line DT0, and a P channel type MOS transistor MP08 for connecting the voltage VDDD lower than the power voltage to the data line DB0. The gate electrodes of the P channel type MOS transistors (MP07 and MP08) are connected to a control signal CVDDD.

The switch circuit 110 is constituted of a P channel type MOS transistor MP17 for connecting the voltage VDDD lower than the power voltage to the data line DT1, and a P channel type MOS transistor MP18 for connecting the voltage VDDD lower than the power voltage to the data line DB1. The gate electrodes of the P channel type MOS transistors (MP17 and MP18) are connected to the control signal CVDDD.

All memory cell ground source electrode lines VSSM in the memory mat 108 are connected by a metal layer, and connected to the power supply by N channel type MOS transistors (MN6 and MN7). The N channel type MOS transistor MN6 is a transistor which connects the power supply VSSS for supplying a voltage higher than the ground potential VSS to the ground source electrode line VSSM, and the gate electrode thereof is connected to a control signal STVSSM. The N channel type MOS transistor MN7 is a transistor which connects the ground potential VSS to the ground source electrode line VSSM, and the gate electrode thereof is connected to a control signal ACVSSM.

The control signal STVSSM is generated by an AND circuit AND0 and an inverter circuit INV1 using a chip selecting signal CS and a mat selecting signal MAT.

The control signal ACVSSM is generated by the AND circuit AND0 using the chip selecting signal CS and the mat selecting signal MAT.

The control signal CVDDD is generated by the AND circuit AND0 using the chip selecting signal CS and the mat selecting signal MAT.

Inputted address and control signal 116 are predecoded by the predecoder 115, and the subword line SWL is generated by a word decoder/driver 114.

The control signal EQ is generated by a NAND circuit NAND0 using the chip selecting signal CS, the mat selecting signal MAT, and the reset pulse ATD.

The control signals (YSWB and YSW) are generated by an inverter circuit INV2 using a Y address AY.

The control signal SA is generated by an AND circuit AND2 and inverter circuits (INV3 and INV4) using the chip selecting signal CS, the mat selecting signal MAT, and the write selecting signals WE and FSEN. FSEN is a timing pulse generated by ATD.

The control signals (RBC and RBCB) are generated by an inverter circuit INV5 using the control signal SA.

The control signals (WBC and WBCB) are generated by an AND circuit AND3 and an inverter circuit INV6 using the chip selecting signal CS, the mat selecting signal MAT, and the write selecting signal WE.

The control signals (CS, WE, YA, MAT and ATD) are generated from the inputted address and control signal using a control circuit 117. For the mat selecting signal MAT, as shown in FIG. 15, another control circuit 118 is sometimes used to prepare a fast mat selecting signal FMAT. The word line is selected in full consideration of a process dispersion/timing in order to prevent a misoperation. However, for circuits driven to read/write with respect to the memory cells (a circuit for controlling an operating potential in a selecting condition, an equalizer/precharge circuit, and the like), as long as the circuits operates faster than the selection of the word line, a control precision of the timing may be dropped. Then, a MOSFET (including either the P channel type or the N channel type) having a high threshold value is used in the control circuit 117 for selecting the word line. The MOSFET (including either the P channel type or the N channel type) having two types of threshold values including high and low threshold values is used in the control circuit 118 which outputs a signal for activating the circuit driven to read/write the information with respect to the memory cell. When the MOSFET having the low threshold value is included, the circuit is weakened with respect to the process dispersion, and it is difficult to obtain the precision of an output timing. However, the control circuit 118 can output the mat selecting signal faster than the control circuit 117. The same circuit constitution may be used to simplify design. The MOSFET having a threshold value lower than that of the control circuit for controlling the selection of the word line is included, and the types of threshold values are increased, so that a circuit for controlling the circuit driven to read/write the information with respect to the memory cell is constituted. Thereby, the precision of the timing of the mat selecting signal MAT for selecting the word line is raised. Additionally, the output timing of the mat selecting signal FMAT for selecting the circuit driven to read/write the information with respect to the memory cell can securely be set to be earlier than the mat selecting signal MAT. This constitution is effective particularly in designing a memory device which is of an asynchronous type and whose precision of the selecting timing is strict. The fast mat selecting signal FMAT is used, instead of the mat selecting signal MAT, in the AND circuit AND0 of a circuit for controlling the memory cell ground source electrode line VSSM, the AND circuit AND1 of a circuit for controlling the VDDD supply, and the NAND circuit NAND0 of a circuit for controlling the equalizer/precharge.

Figure 6:
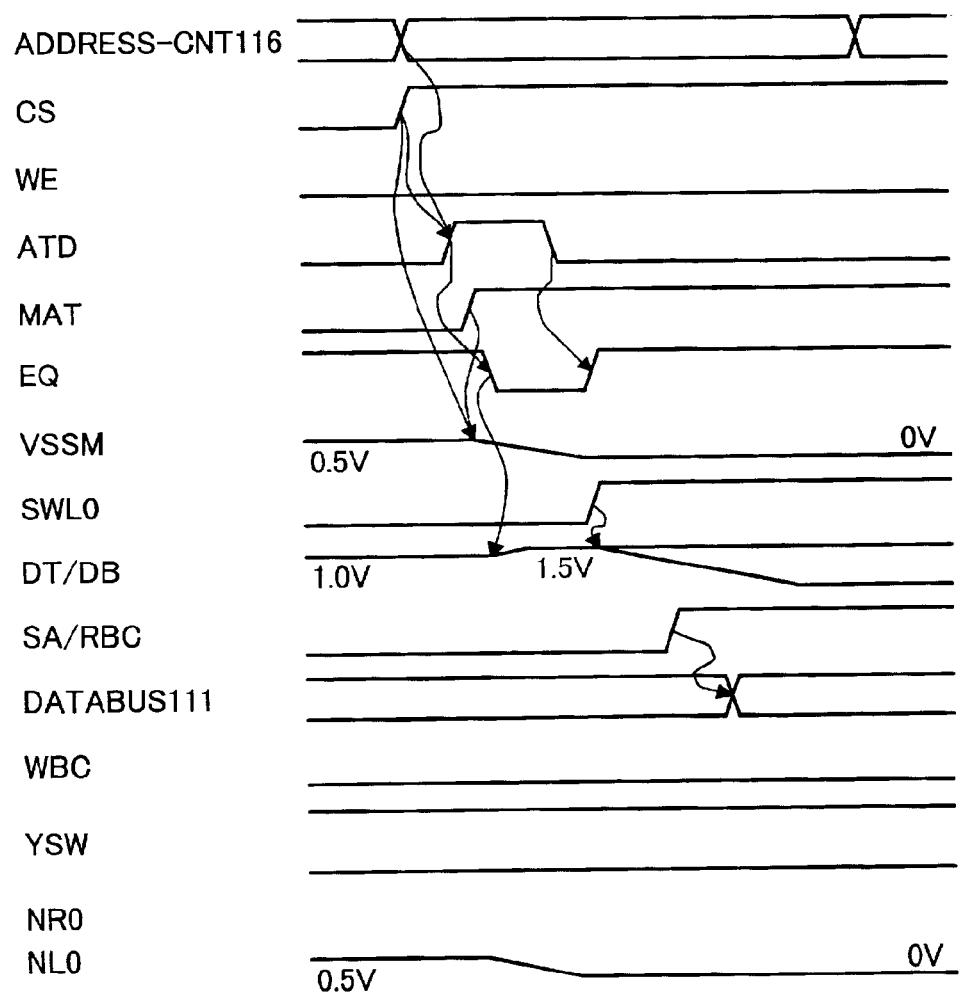
FIG. 6 shows operating waveforms during standby and during read according to the third embodiment.

A read operation performed from the standby mode will next be described with reference to the operating waveform shown in FIG. 6. When the chip selecting signal CS is in "L" ("LOW" level) or the mat is not selected, the memory mat is in the standby mode. In this case, the voltage VSSS higher than the ground potential, for example, 0.5 V is supplied to the memory cell ground source electrode line VSSM. Moreover, the voltage VDDD lower than the power voltage VDD, for example, 1.0 V is supplied to the data lines (DT and DB). In this case, the storage node NL0 of the memory cell CELL0 indicates 0.5 V, and NR0 indicates the power voltage VDD, for example, 1.5 V. A voltage of 1.0 V lower than the power voltage of 1.5 V is supplied between the gate and source electrodes of the P channel type MOS transistor MP01 in the ON-state, and thereby the gate tunnel leakage current is reduced. Moreover, a voltage of 1.0 V lower than the power voltage of 1.5 V is supplied between the gate and source electrodes of the N channel type MOS transistor MN00 in the ON-state, and thereby the gate tunnel leakage current is reduced. Furthermore, a voltage of 1.0 V lower than the power voltage of 1.5 V is supplied between the gate and source electrodes of the transfer N channel type MOS transistors (MN02 and MN03) in the OFF-state, and thereby the GIDL current is reduced.

When the chip selecting signal CS turns to "H" or the address changes, the ATD pulse is generated and the read operation is started. The memory cell ground source electrode line VSSM of the selected mat 108 is set to the ground potential 0 V by the mat selecting signal MAT and the chip selecting signal CS. Moreover, the P channel type MOS transistors (MP07, MP08, MP17 and MP18) having supplied the voltage VDDD to the data lines (DT and DB) turn off.

The data lines (DT and DB) are precharged to obtain the power voltage VDD by the control signal EQ generated from the ATD pulse.

As a result, the storage node NL0 of the memory cell CELL0 indicates 0 V, and NR0 indicates the power voltage VDD, for example, 1.5 V. The power voltage of 1.5 V is supplied between the gate and source electrodes of the P channel type MOS transistor MP01 in the ON-state, and thereby the gate tunnel leakage current increases. Moreover, the power voltage of 1.5 V is supplied between the gate and source electrodes of the N channel type MOS transistor MN00 in the ON-state, and thereby the gate tunnel leakage current increases. Furthermore, the power voltage of 1.5 V is supplied between the gate and source electrodes of the transfer N channel type MOS transistors (MN02 and MN03) in the OFF-state, and thereby the GIDL current increases.

Thereafter, the word line SWL0 is selected, a micro potential difference is generated in the data lines (DT and DB), the sense amplifier circuit 103 is activated by the control signal SA, thereby the micro potential difference is amplified, and the data is outputted to the data bus 111.

Figure 7:
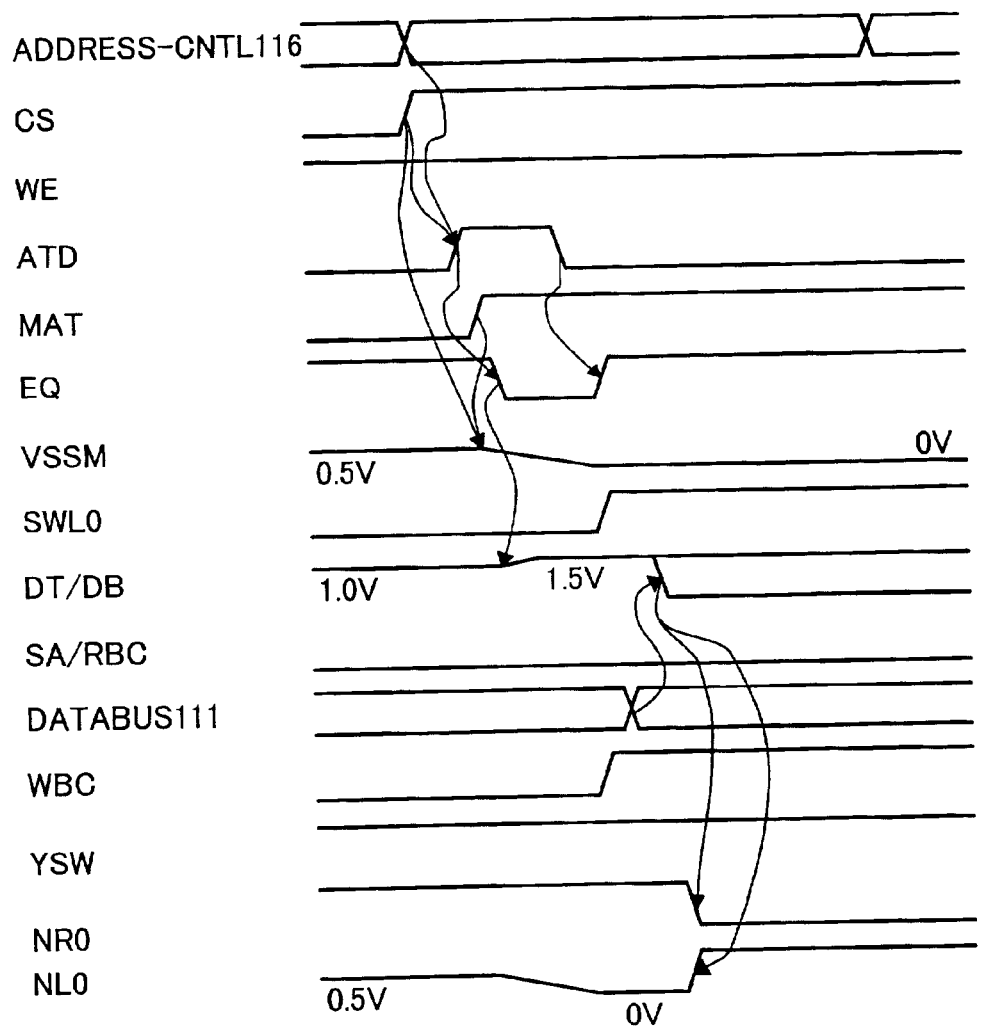
FIG. 7 shows the operating waveforms during standby and during write according to the third embodiment.

A write operation performed from the standby mode will next be described with reference to the operating waveform shown in FIG. 7. The standby mode is similar to the read operation.

When the chip selecting signal CS turns to "H" or the address changes, the ATD pulse is generated and the write operation is started. The memory cell ground source electrode line VSSM of the selected mat 108 is set to the ground potential 0 V by the mat selecting signal MAT and the chip selecting signal CS. Moreover, the P channel type MOS transistors (MP07, MP08, MP17 and MP18) having supplied the voltage VDDD to the data lines (DT and DB) turn off.

The data lines (DT and DB) are precharged by the control signal EQ generated from the ATD pulse to obtain the power voltage VDD.

As a result, the storage node NL0 of the memory cell CELL0 indicates 0 V, and NR0 indicates the power voltage VDD, for example, 1.5 V. The power voltage of 1.5 V is supplied between the gate and source electrodes of the P channel type MOS transistor MP01 in the ON-state, and thereby the gate tunnel leakage current increases. Moreover, the power voltage of 1.5 V is supplied between the gate and source electrodes of the N channel type MOS transistor MN00 in the ON-state, and thereby the gate tunnel leakage current increases. Furthermore, the power voltage of 1.5 V is supplied between the gate and source electrodes of the transfer N channel type MOS transistors (MN02 and MN03) in the OFF-state, and thereby the GIDL current increases.

Thereafter, the word line SWL0 is selected. The signal of the data bus 111 is inputted into the data lines (DT and DB), and the data is written in the memory cell CELL by this signal.

Figure 13:
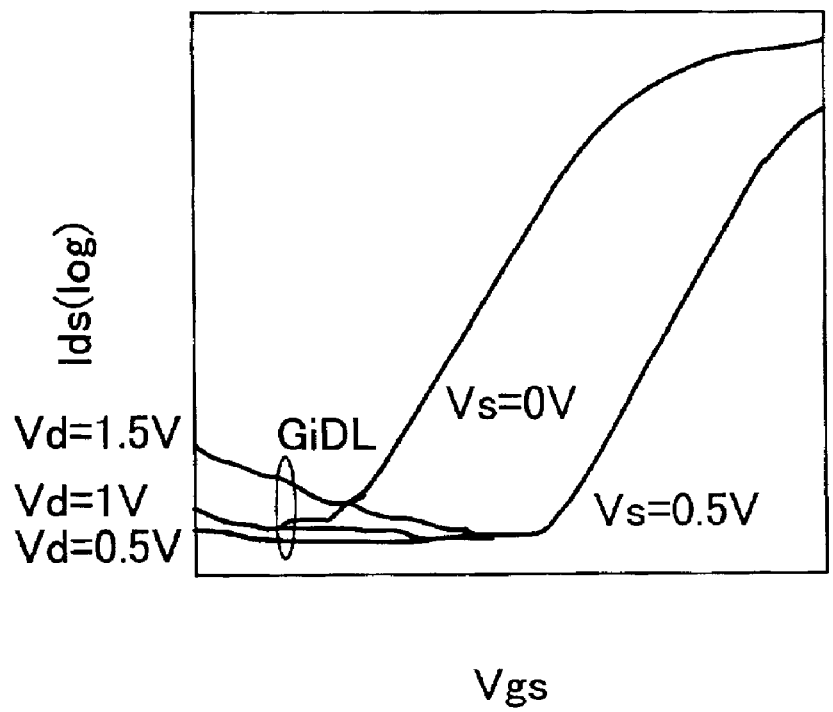
FIG. 13 shows a current reducing effect of a MOS transistor in the present system.

In the present embodiment, the source voltage of the memory cell is raised to 0.5 V in the standby mode, but the power supply of the memory cell may be lowered to 1.0 V. Additionally, when the standby mode changes to the active mode, this transition is requested to be performed at a high speed as compared with when the active mode changes to the standby mode. Therefore, when the source voltage is raised to 0.5 V in the standby mode, a burden on a power supply circuit is reduced as compared with when the power supply of the memory cell is lowered to 1.0 V. Therefore, it is more advantageous to raise the source voltage to 0.5 V. Moreover, as seen from characteristics of FIG. 13, even with the same 0.5 V, to raise the source voltage on a low potential side can be said to be advantageous in lowering the current.

Figure 14:
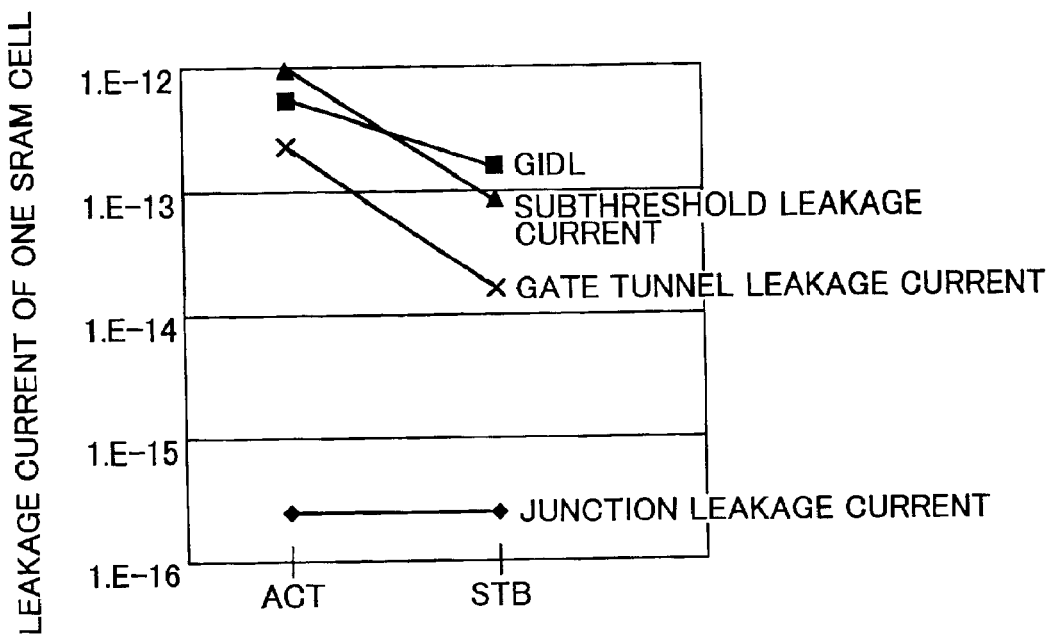
FIG. 14 shows a leakage current reducing effect according to the third embodiment.
Figure 16:
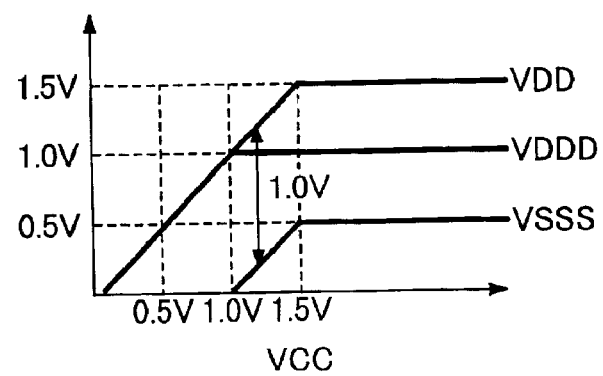
FIG. 16 is a characteristic diagram of a voltage down converter according to the third embodiment.

FIG. 14 shows leakage currents of one SRAM cell in the standby and active modes. The GIDL current, the subthreshold leakage current, and GIDL are all reduced in the standby mode. FIG. 16 shows one example of characteristics of the voltage down converter PWR. When the potentials VDDD to be supplied to a bit line, and the like, and the operating potentials (high potential VDD and low potential VSSS) to be supplied to the memory cells are generated, and when the potential VCC supplied from the outer pad indicates a value not less than a predetermined value, the potential supplied from the outer pad is controlled and outputted in this constitution. For example, when the potential supplied from the outer pad is 1.5 V or less, the high potential VDD supplied to the memory cell is the same as the power voltage VCC supplied from the outer pad. When VCC is 1.5 V or more, VDD is controlled to be constant at 1.5 V. Moreover, for the potential VDDD lower than the power voltage, the VCC of 1.0 V or less is the same as the potential VCC supplied from the outer pad, and the VCC of 1.0 V or more is controlled to be constant at 1.0 V. The potential VSSS higher than the ground potential is 0 V, when the VCC is 1.0 V or less. When the potential VCC supplied from the outer pad is 1.0 V or more, the potential is controlled based on the potential VDD on the high potential side supplied to the memory cell so as to be a value lower by 1.0 V. Thereby, when the power voltage VCC inputted from the outside of the semiconductor chip fluctuates, the voltage supplied to the memory cell is constantly 1.0 V and the data can be prevented from being destroyed. Additionally, since the potential VSS on the low potential side supplied from another outer pad is the ground potential, the potential can be considered not to fluctuate. The application of the operating potential generation circuit which can be controlled by a feedback circuit is not limited to the semiconductor integrated circuit including the memory, and is also effective in the above-described embodiment.

In the present embodiment, to reduce the GIDL current, the semiconductor device includes the N channel type MOS transistor in which arsenic is used in a region to make a contact, and phosphorus is used in an extension region in a source/drain region. In the semiconductor device including the SRAM, the above-described N channel type MOS transistor is used in the N channel type MOS transistor in the memory cell of the SRAM, and the N channel type MOS transistor in which arsenic is used both in the region to make the contact and the extension region is used in the N channel type MOS transistor of a peripheral circuit to control the memory cell.

Figure 22A:
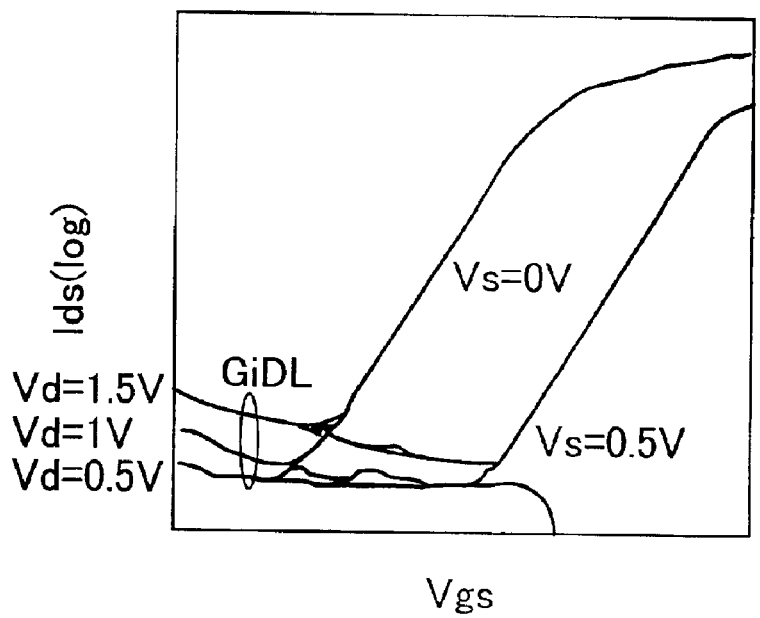
FIGS. 22A and 22B are characteristic diagrams in which the manufacturing method of the present invention is applied.
Figure 22B:
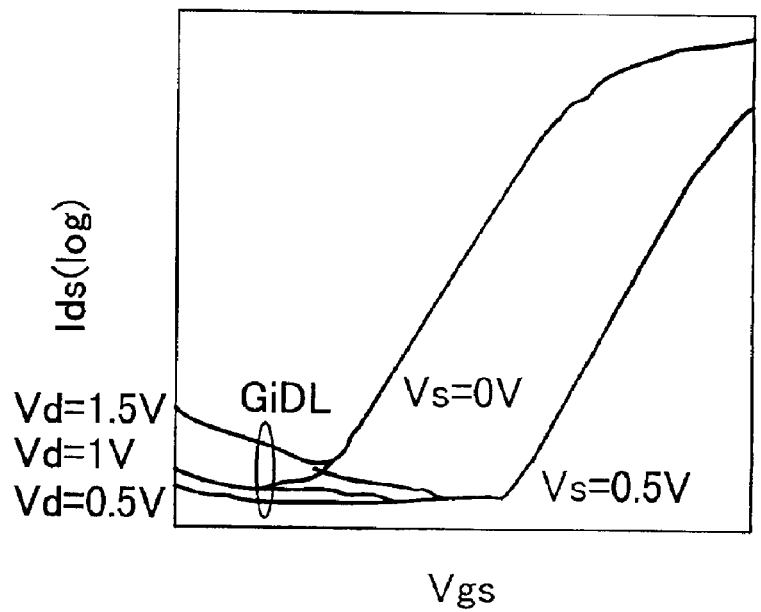

In FIG. 22, arsenic is used in the regions to make the contact in the source/drain regions of the N channel type MOS transistor. When arsenic is used in the extension region, a gate voltage Vgs and characteristics Ids of the current between the source and drain are shown in FIG. 22A. When phosphorus is used in the extension region, the gate voltage Vgs and characteristics Ids of the current between the source and drain are shown in FIG. 22B. Coordinates are the same in FIGS. 22A and 22B. As apparent from the waveforms, an off leakage current in the gate voltage of 0.0 V apparently drops in FIG. 22B where phosphorus is used. Furthermore, in the system of the present invention (the system in which an operating potential Vssm of the memory cell is raised from 0.0 V to 0.5 V in the standby mode), when phosphorus is used in the extension region, the off leakage current can effectively be reduced. It is seen that the effect in a high-temperature operating region is remarkable, although this is not shown here. Since phosphorus (P) more largely fluctuates in device characteristics such as Vth-lowering characteristic than arsenic (As), and a current driving force drops as compared with As, it is difficult to adjust an ion implantation concentration or an energy. Therefore, in general, arsenic has been used in the region to make the contact and the extension region. In JP-A-1997-135029, a device structure is disclosed in which phosphorus is used both in the region to make the contact and the extension region. However, the present inventor et al, has disclosed that the implanting of phosphorus in the extension region is effective for reducing the GIDL current, and the using of arsenic in the region to make the contact is effective from capabilities (current driving force, short channel characteristic) of the device. These effects are obtained because a band bend by a vertical electric field from the gate electrode is alleviated by implanting phosphorus in the extension region overlapping under the gate electrode. Moreover, when an implantation profile is broadened, a junction electric field strength of the vertical direction of channel and extension regions is alleviated, and an effect of reduction of PN junction leak also contributes to this.

FIGS. 17 to 21 are sectional views showing one example of a manufacturing method of the semiconductor device according to the present embodiment in order of steps. The respective views show an N channel type MOS transistor Qmn and P channel type MOS transistor Qmp constituting a memory cell area MC, an N channel type MOS transistor Qpn and P channel type MOS transistor Qpp constituting a peripheral circuit area PERI, and an N channel type MOS transistor Qhn and P channel type MOS transistor Qhp constituting a high voltage inflicted area HV in a divided manner. The N channel type MOS transistor Qmn constituting the memory cell area MC is used in the driver and transfer MOS transistors of each memory cell CELL of FIG. 5. The P channel type MOS transistor Qmp constituting the memory cell area MC is used in the load MOS transistor of each memory cell CELL of FIG. 5. The N channel type MOS transistor Qpn and P channel type MOS transistor Qpp constituting the peripheral circuit area PERI are used in the P and N channel type MOS transistors other than those of the memory cell area of FIG. 5. That is, the MOS transistors for use in the sense amplifier circuit (103), read data drive circuit (104), write amplifier circuit (105), equalizer/precharge circuits (99 and 100) and Y switch circuits (101 and 102), word decoder/driver (114), predecoder (115), and control circuit (117) are included. The N channel type MOS transistor Qhn and P channel type MOS transistor Qhp constituting the high voltage inflicted area HV are used in the N and P channel type MOS transistors constituting the circuits having different operating voltages of input and output, that is, the input buffer (INBUF), voltage down converter (PWR), and input/output circuit IO of FIG. 15.

The method will be described hereinafter in order of the steps with reference to the drawings. First, as shown in FIG. 17A, a semiconductor substrate 200 formed of p type single crystal silicon is prepared, and an isolating region 201 is formed in the main surface of the semiconductor substrate 200. The isolating region 201 can be formed, for example, as follows. First, a silicon oxide layer (SiO$_2$) and silicon nitride layer (Si$_3$N$_4$) are successively formed on the main surface of the semiconductor substrate 200, a patterned photo resist is used to etch the silicon nitride layer, and the etched silicon nitride layer is used as a mask to form a trench type isolating region in the semiconductor substrate 200. Thereafter, an insulating layer to fill in the trench type isolating region, such as the silicon oxide layer, is deposited, a CMP process or the like is used to remove the silicon oxide layer of the region other than the trench type isolating region, and further a wet etching process or the like is used to remove the silicon nitride layer. Thereby, the isolating region (trench isolation) 201 is formed. The isolating region is not limited to the trench type isolating region, and may also be formed of a field insulator, for example, by a local oxidation of silicon (LOCOS) process. To alleviate a damage of the surface of the semiconductor substrate by the subsequent ion implanting step, a thin silicon oxide layer is deposited.

Thereafter, the patterned photo resist is used as the mask to ion-implant an impurity, and p type wells 210 and 212 and n type wells 211 and 213 are formed as shown in FIG. 17B. Impurities indicating a p conductivity type such as boron B and boron fluoride BF2 are ion-implanted in the p type wells, and impurities indicating an n conductivity type such as phosphorus P and arsenic As are ion-implanted in the n type wells. Thereafter, impurities (the impurity (P) indicating the n conductivity type in the N channel type MOS transistor, and the impurity (BF2) indicating the p conductivity type in the P channel type MOS transistor) for controlling the threshold value of the MOSFET are ion-implanted in the respective well regions.

Subsequently, as shown in FIG. 17C, a silicon oxide layer 221 forming a gate insulating layer is formed. In this case, photolithography and etching techniques were used to form a thick gate oxide layer in the high voltage inflicted area, and a thin gate oxide layer in the peripheral circuit area and the memory cell area. In the present embodiment, the film thickness of the thick gate oxide layer was set to 8.0 nm in order to handle an external input/output of 3.3 V, and the thickness of the thin gate oxide layer was set to 3.0 nm, at which the gate leakage current raises a problem in the standby mode. After the oxide layer other than the layer of the high voltage inflicted area is removed using the photolithography/wet etching technique, the layer is thermally oxidized and the oxide films having two types of film thickness are formed. Thereafter, a poly crystal silicon layer 222 for the gate electrode is deposited, and resist masks 223 are used to ion-implant the n/p type impurities (phosphorus and boron) in the electrode regions of the N and P channel type MOS transistors.

Figures 18A, 18B, 18C:
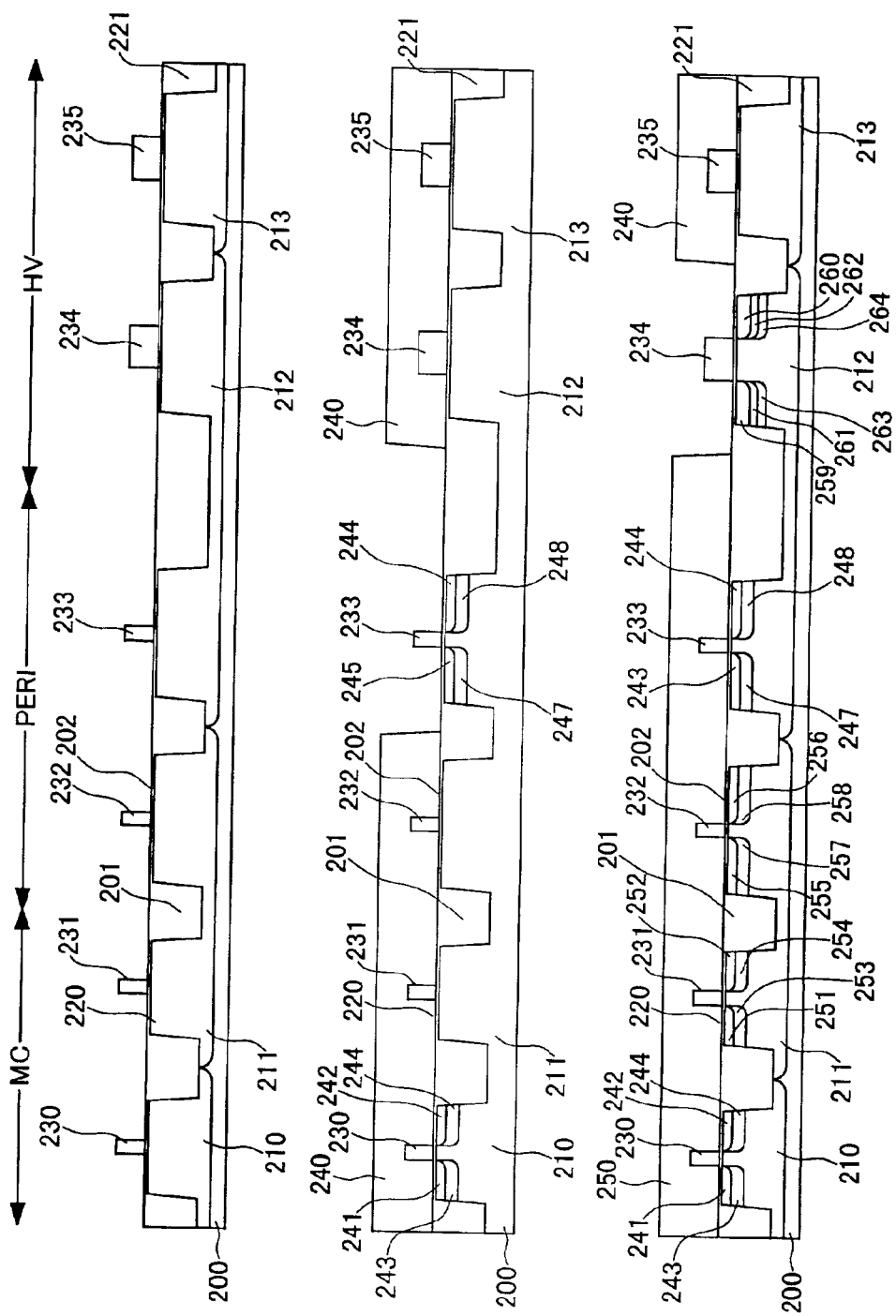
FIGS. 18A–18C are main part sectional views of the semiconductor substrate showing the manufacturing method of the semiconductor integrated circuit of the present invention.
Figure 19A:
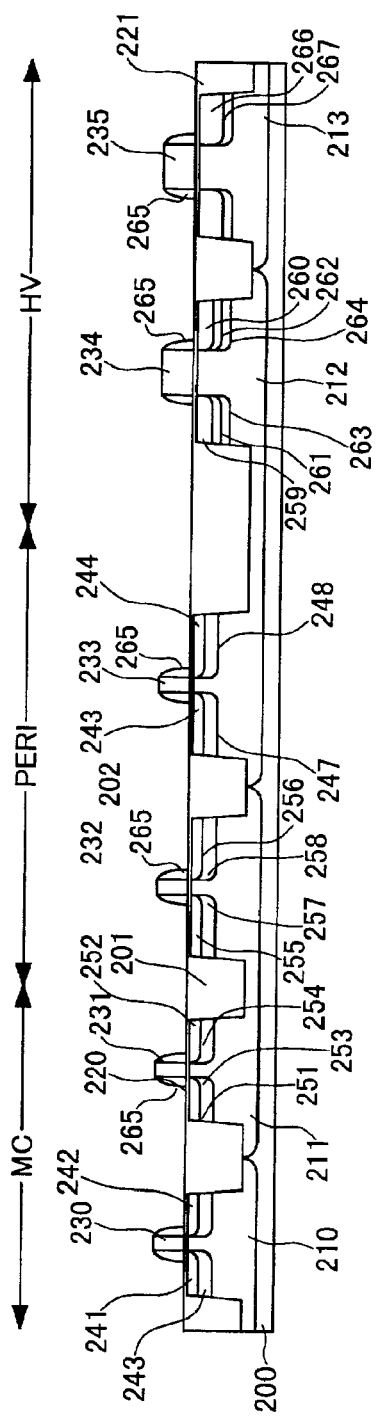
FIGS. 19A–19C are main part sectional views of the semiconductor substrate showing the manufacturing method of the semiconductor integrated circuit of the present invention.

As shown in FIG. 18A, the photolithography/dry etching is used to process, and thereby form gate electrodes 230, 231, 232, 233, 234 and 235. Subsequently, as shown in FIG. 18B, a semiconductor region forming the extension region, and a semiconductor region for suppressing a punch through, having the conductivity type opposite to the type of the extension region (the same conductivity type as that of a well, and concentration higher than that of a well region), are formed by an ion implanting process. In the N channel type MOS transistor, masks (steps) are changed with the memory cell area MC, the peripheral circuit area PERI and the high voltage inflicted area HV to perform the ion implantation. In the memory cell area MC, to reduce the GIDL current in the standby mode, phosphorus as the n type impurity and boron as the p type impurity are implanted to form n type semiconductor regions 241 and 242 and p type semiconductor regions 243 and 244. In this case, the other regions (P channel type MOS transistor region, and the peripheral circuit region/high voltage inflicted region) are masked with the resist. In the peripheral circuit area PERI, phosphorus as the n type impurity and boron as the p type impurity are implanted to form n type semiconductor regions 241 and 242 and p type semiconductor regions 243 and 244 in order to realize the high-speed operation. In this case, the other regions (P channel type MOS transistor region, and the memory cell region/high voltage inflicted region) are masked with the resist. Subsequently, as shown in FIG. 18C, the p type impurity (boron) and the n type impurity (As) are implanted in the n type well 211 forming the P channel type MOS transistor, and thereby semiconductor regions 251, 254, 255 and 256 forming the extension region, and semiconductor regions 253, 254, 257 and 258 for suppressing the punch through, which are of the same conductivity type as that of the well and has a concentration higher than the well region, are formed. In the P channel type MOS transistor, since the type and condition (energy) of the ion implantation of the peripheral circuit area PERI are not changed, the same mask (step) is used. When the ion is implanted, the region forming the N channel type MOS transistor and the region forming the P channel type MOS transistor of the high voltage inflicted area HV are masked with the resist. When arsenic and phosphorus as the n type impurities are implanted in the N channel type MOS transistor of the high voltage inflicted area in order to alleviate the vertical electric field of an edge, n type semiconductor regions 259, 260, 261 and 262 and p type semiconductor regions 263 and 264 are formed. Because of a difference of distribution coefficient, the n type semiconductor regions 259 and 260 in the vicinity of the semiconductor surface are mainly constituted of arsenic, and the n type semiconductor regions 261 and 262 implanted deeper have a main component of phosphorus. Subsequently, as shown in FIG. 19A, the p type impurity (boron) and the n type impurity (As) are implanted in the n type well region 213 forming the P channel type MOS transistor of the high voltage inflicted area HV, and thereby a p type semiconductor region 266 forming the extension region, and a semiconductor region 267 which suppresses the punch through and has the same conductivity type as the well and the concentration higher than that of the well region are formed. In the present embodiment, the masks (steps, ion implantation conditions) are changed with the high voltage inflicted area HV, the memory cell area MC and the peripheral circuit area PERI. However, when a withstand pressure can satisfy the properties of a product, the P channel type MOS transistor can be formed with one mask (step) without changing the type and ion implantation condition (energy) of the impurity in the memory cell area MC, the peripheral circuit area PERI and the high voltage inflicted area HV.

Additionally, the ion implantation order of the extension region and the semiconductor region having the conductivity type opposite to that of the well and having the high concentration is not limited. That is, the ion implantation of the region forming the P channel type MOS transistor may be performed before the ion implantation into the N channel type MOS transistor. Moreover, according to FIGS. 18B and 18C, in the N channel type MOS transistor, the ion implantation is performed in order of the memory cell area, the peripheral circuit area and the high voltage inflicted area, but the order is not limited. To perform the ion implantation of the high voltage inflicted area, depending on an impurity amount, the memory cell area and the peripheral circuit area are not covered with the masks during the ion implantation, and it is also possible not to prepare the mask for the high voltage inflicted area. However, when there is a difference in the impurity amount, another mask needs to be prepared as shown in FIG. 18C.

Figure 19B:
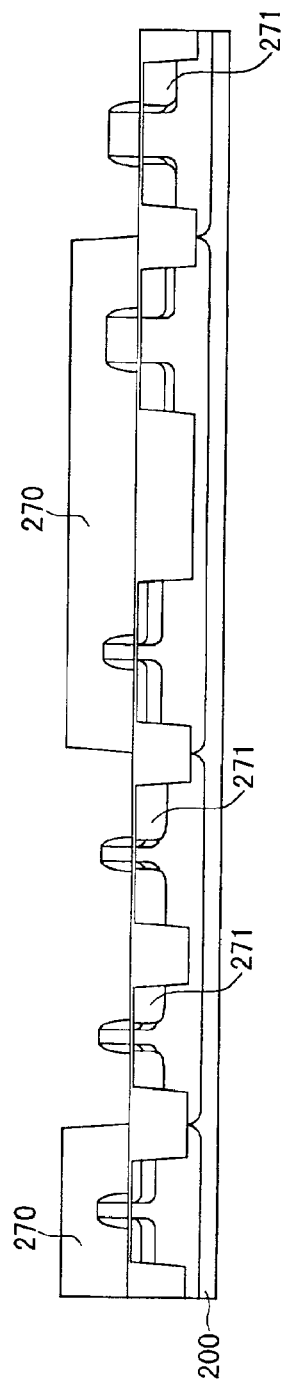
Figure 19C:
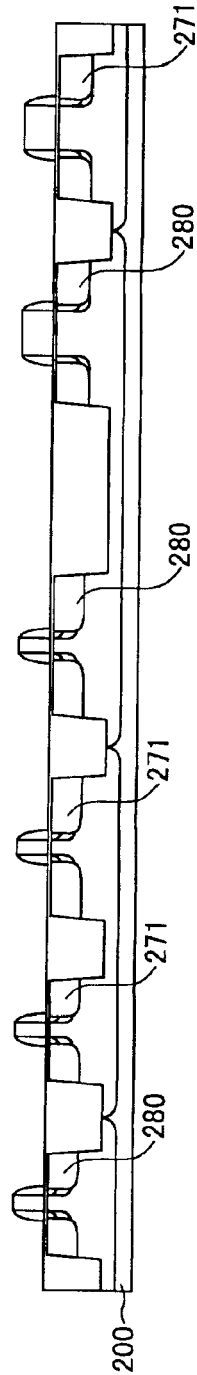
Figure 20:
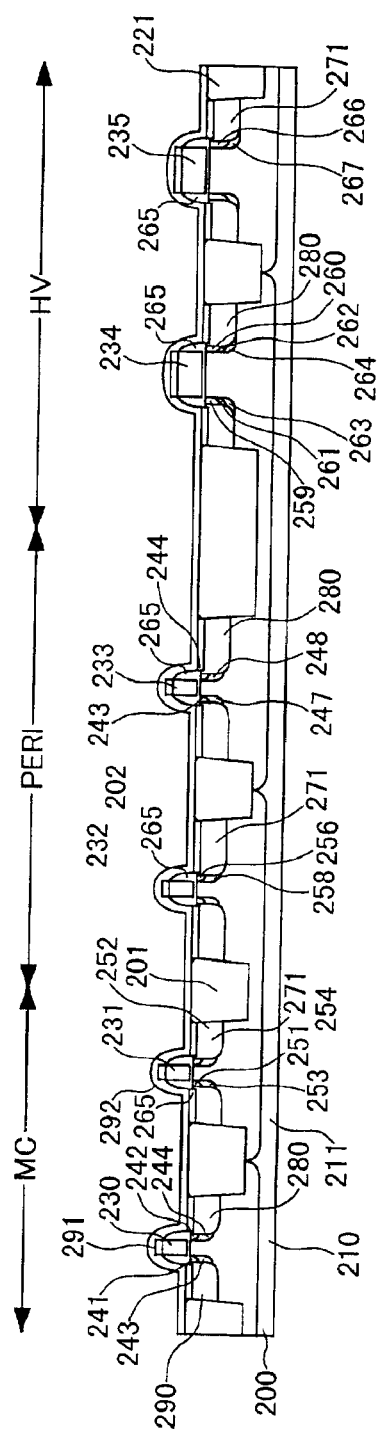
FIG. 20 is a main part sectional view of the semiconductor substrate showing the manufacturing method of the semiconductor integrated circuit of the present invention.
Figure 21:
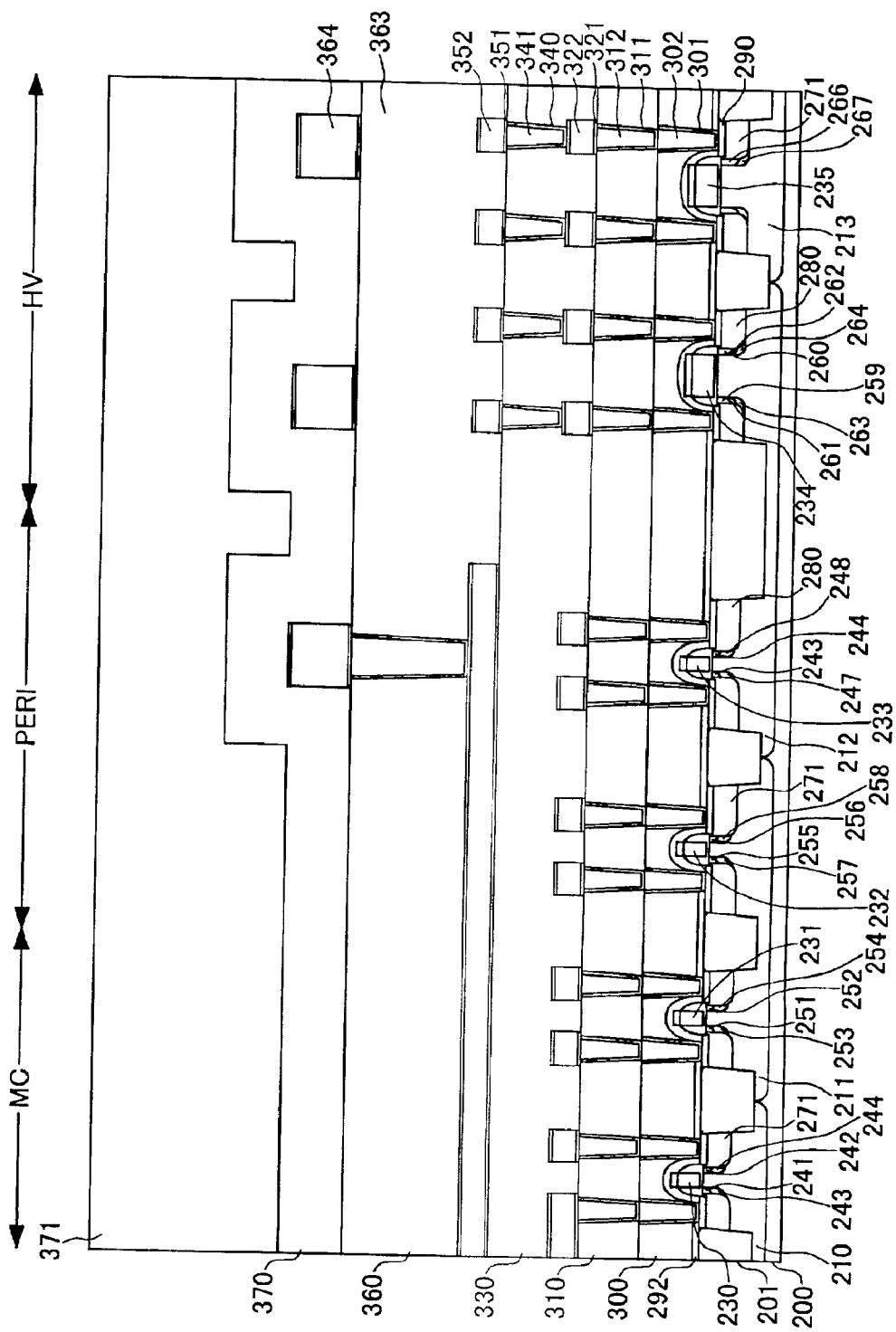
FIG. 21 is a main part sectional view of the semiconductor substrate showing the manufacturing method of the semiconductor integrated circuit of the present invention.

As shown in FIG. 19A, after the silicon oxide layer is deposited on the semiconductor substrate 200, for example, by a CVD process, the silicon oxide layer is etched having a selectivity for etching. Thereby, side wall spacers (gate side wall layers) 265 are formed on side walls of the gate electrodes 230, 231, 232, 233, 234 and 235. Subsequently, as shown in FIG. 19B, photo resists 270 are used as masks, the p type impurity (boron) is ion-implanted in the n type wells 210 and 212, and p type semiconductor regions 271 are formed on opposite sides of the gate electrode 231, 232 and 235 on the n type well. The p type semiconductor regions 271 are formed in the gate electrodes 231, 232 and 235 and the side wall spacers 265 in a self aligned manner, and function as the source/drain region of a p channel MISFET. Similarly, the photo resist is used as the mask to ion-implant the n type impurity (As) in the p type wells 211 and 213, and n type semiconductor regions 280 which are to make a contact with the electrodes are formed. The n type semiconductor regions 280 are formed with respect to the gate electrodes 230, 233 and 234 and the side wall spacers 265 in the self aligned manner. Moreover, the n type semiconductor regions 280 function as the source/drain region of the n channel MISFET. As a result, the low-concentration impurity semiconductor region is formed before the side wall spacers 265 are formed. After the side wall spacers 265 are formed, transistors having a lightly doped drain (LDD) structure to form the high-concentration impurity semiconductor region are formed in the respective regions (FIG. 19C). Additionally, in the present invention, the source/drain region of the N channel type MOS transistor is precedently formed, but the P channel type MOS transistor may precedently be formed.

Subsequently, as shown in FIG. 20A, the silicon oxide layer is etched, the surface of the source/drain semiconductor region is exposed, a refractory metal layer (Co, Ti, W, Mo, Ta) is deposited and annealed, the unreacted refractory metal layer is removed, and a part of the surface of the semiconductor region forming the gate electrodes 230, 231, 232, 233, 234 and 235 and the source/drain is subjected to silicidation (290 and 291). Thereafter, a silicon nitride layer 292 is deposited.

As shown in FIG. 19B, after the silicon oxide layer is deposited on the semiconductor substrate 200 by the CVD or sputtering process, the silicon oxide layer is polished, for example, by a CMP process, and thereby a first insulating layer between layers 300 having a flatted surface is formed. Subsequently, the photolithography technique is used to form a contact hole in the first insulating layer between layers 300. The contact hole is formed in a necessary portion on the n or p type semiconductor region. A plug is formed in the contact hole, for example, as follows. First, a Titan nitride layer 301 is formed on the whole surface of the semiconductor substrate 200 including the inside of the contact hole. The Titan nitride layer can be formed, for example, by the CVD process. Since the CVD process is superior in a step coating property, the Titan nitride layer having a uniform film thickness can be formed even in the fine contact hole. Subsequently, a metal (lithium) layer 302 to fill in the contact hole is formed. The metal layer can be formed, for example, by the CVD process. Subsequently, the metal layer and Titan nitride layer of the region other than the contact hole are removed, for example, by the CMP process so that the plug can be formed. When such silicide layer is formed, contact resistance in the bottom of a contact hole 12 can be reduced. Similarly, a contact hole is formed in a second insulating layer between layers 310. The contact hole is formed by a Titan nitride layer 311 and a metal (Tungsten) layer 312. These plugs are used in connecting a local wire. Subsequently, for example, a Titan nitride layer 321 and an aluminum layer 322 are formed on the whole surface of the semiconductor substrate 200 by the CVD or sputtering process, the deposited layer is patterned by the photolithography technique, and the wire of a first wire layer is formed. The first wire layer is used in a bit line and the like in a memory area. The insulating layer with which the wire is to be coated, such as a silicon oxide layer, is formed, the insulating layer is flatted by the CMP process, and a second insulating layer between layers 330 is formed. A photo resist having an opening in a region in which the contact hole is formed is formed on the second insulating layer between layers 330, and the photo resist is used as the mask to etch the layer. Thereby, the contact hole is formed in the predetermined region of the second insulating layer between layers 330. The plug is formed in the contact hole. The plug can be formed as follows. First, a barrier metal layer 340 is formed on the whole surface of the semiconductor substrate 200 including the inside of the contact hole, and a metal (Tungsten) layer 341 to fill in the contact hole is further formed. Thereafter, the metal layer and barrier metal layer of the region other than the contact hole are removed by the CMP process to form the plug. The barrier metal layer has a function of preventing Tungsten from being diffused into peripheries such as the second insulating layer between layers 330, and examples thereof include the Titan nitride layer. Additionally, the examples are not limited to the Titan nitride layer, and other metal layers may be used as long as the layer has the function of preventing Tungsten from being diffused. For example, instead of Titan nitride, Tantalum (Ta) and Tantalum nitride (TaN) can also be used. Similarly as the first wire layer, wire (351 and 352) of a second wire layer are formed. An insulating layer with which the wires are to be coated is formed, and flatted by the CMP process so that a third insulating layer between layers 360 is formed. Similarly as the second insulating layer between layers 330, the contact hole is formed in the third insulating layer between layers 360, and plugs (361 and 362) are formed in the contact hole. Similarly as the second wire layer, wires (363 and 364) of a third wire layer are formed. An insulating layer 370 with which the wires are coated is formed, and the silicon nitride layer is formed as a passivation layer 371 on the insulating layer. A probing process, resin molding process and the like are performed before shipment of the product.

As a result of trial preparation of memory cells, in which arsenic is implanted in the extension region and the region to make the contact and in which phosphorus is supplied in the extension region, using the present device structure, it has been seen that a standby current can be reduced by about 50% at 25° C. and 90° C. That is, the standby current of the semiconductor device can be suppressed not only at a usual operation temperature but also at a high temperature. When the present structure is employed, there is an effect that an operation guarantee temperature (e.g., 70° C. or less) of the product can be set to be high.

When the present device structure is employed in a thin layer NMOS, the standby current of the semiconductor device can be reduced to about 1.0 $\mu$A from 2.5 $\mu$A in the conventional As structure. This effect is produced because the main component (about 70%) of the standby current is the GIDL current of NMOS.

Additionally, only phosphorus is used in the extension region of the N channel type MOS transistor of the memory cell area, but phosphorus and arsenic may sometimes be implanted for a high-speed operation. In this case, two types of ion sources are necessary, but there is an effect that a driving current increases. The structure is similar to that of the N channel type MOS transistor of the high voltage inflicted area. Since it is necessary to perform the ion implantation with an energy lower than that of the high voltage inflicted MOS, it is necessary to change the mask for the ion implantation of the extension region of the high voltage inflicted area. As a result, the breadth of the semiconductor region becomes narrower than that of the high voltage inflicted area.

<Fourth Embodiment>

Figure 8:
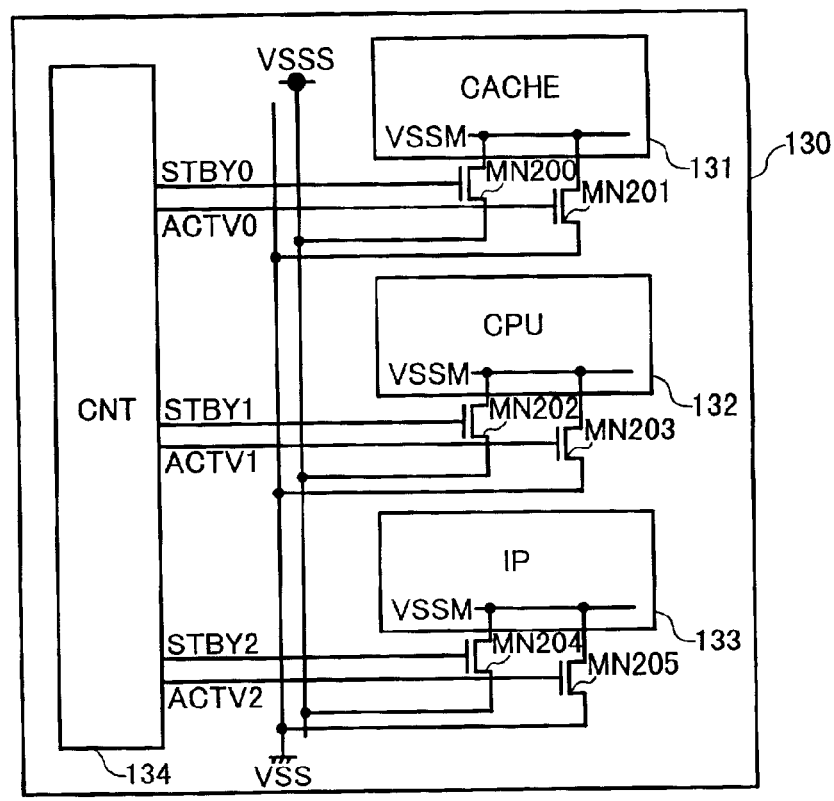
FIG. 8 is a circuit diagram of the semiconductor integrated circuit according to a fourth embodiment.

FIG. 8 shows an embodiment in which the present invention is applied to a microprocessor. The circuit is formed on the semiconductor substrate such as single crystal silicon using the semiconductor integrated circuit manufacturing technique in which the insulating layer for use in the gate of the MOS transistor has a thickness of 4 nm or less, and the tunnel leakage current is $10^{-12}$ A/$\mu$m$^2$ or more at the power voltage of 1.5 V.

A microprocessor 130 is constituted of an IP circuit 133, a cache memory 131 and a CPU 132. Moreover, a control circuit 134 for controlling the active and standby modes is also mounted on the microprocessor 130.

The ground source electrode line VSSM of the cache memory 131 is connected to the potential VSSS higher than the ground potential via an N channel type MOS transistor MN200, and is also connected to the ground potential VSS via an N channel type MOS transistor MN201. The gate electrode of the N channel type MOS transistor MN200 is connected to a control signal STBY0. The gate electrode of the N channel type MOS transistor MN201 is connected to a control signal ACTV0.

The ground source electrode line VSSM of the CPU circuit 132 is connected to the potential VSSS higher than the ground potential via an N channel type MOS transistor MN202, and is also connected to the ground potential VSS via an N channel type MOS transistor MN203. The gate electrode of the N channel type MOS transistor MN202 is connected to a control signal STBY1. The gate electrode of the N channel type MOS transistor MN203 is connected to a control signal ACTV1.

The ground source electrode line VSSM of the IP circuit 133 is connected to the potential VSSS higher than the ground potential via an N channel type MOS transistor MN204, and is also connected to the ground potential VSS via an N channel type MOS transistor MN205. The gate electrode of the N channel type MOS transistor MN204 is connected to a control signal STBY2. The gate electrode of the N channel type MOS transistor MN205 is connected to a control signal ACTV2.

When the control signal STBYO indicates "H", and ACTV0 indicates "L", the cache memory 131 is brought into the standby mode, and the potential of VSSM becomes the voltage VSSS higher than the ground potential, for example, 0.5 V. In this case, the voltage supplied between the gate and source of the MOS transistor drops, and thereby the gate tunnel leakage current is reduced. Additionally, the data in the cache memory is retained without being destroyed.

When the control signal STBY0 indicates "L", and ACTV0 indicates "H", the cache memory 131 is brought into the active mode, and the potential of VSSM corresponds to the ground potential VSS. In this case, the gate tunnel leakage current of the MOS transistor increases as compared with the standby mode.

When the control signal STBY1 indicates "H", and ACTV1 indicates "L", the CPU circuit 132 is brought into the standby mode, and the potential of VSSM becomes the voltage VSSS higher than the ground potential, for example, 0.5 V. In this case, the voltage supplied between the gate and source of the MOS transistor drops, and thereby the gate tunnel leakage current is reduced. Additionally, the data in a register file and latch is retained without being destroyed.

When the control signal STBY1 indicates "L", and ACTV1 indicates "H", the CPU circuit 132 is brought into the active mode, and the potential of VSSM corresponds to the ground potential VSS. In this case, the gate tunnel leakage current of the MOS transistor increases as compared with the standby mode.

When the control signal STBY2 indicates "H", and ACTV2 indicates "L", the IP circuit 133 is brought into the standby mode, and the potential of VSSM becomes the voltage VSSS higher than the ground potential, for example, 0.5 V. In this case, the voltage supplied between the gate and source of the MOS transistor drops, and the gate tunnel leakage current is reduced.

When the control signal STBY2 indicates "L", and ACTV2 indicates "H", the IP circuit 133 is brought into the active mode, and the potential of VSSM corresponds to the ground potential VSS. In this case, the gate tunnel leakage current of the MOS transistor increases as compared with the standby mode.

<Fifth Embodiment>

Figure 9:
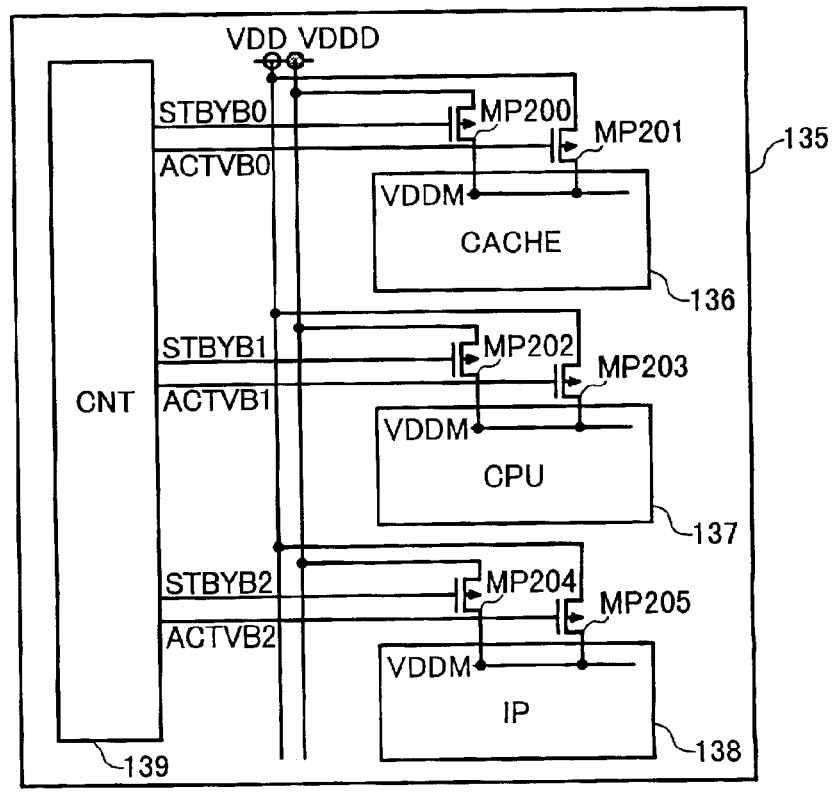
FIG. 9 is a circuit diagram of the semiconductor integrated circuit according to a fifth embodiment.

FIG. 9 shows an embodiment in which the present invention is applied to the microprocessor. The circuit is formed on the semiconductor substrate such as single crystal silicon using the semiconductor integrated circuit manufacturing technique in which the insulating layer for use in the gate of the MOS transistor has a thickness of 4 nm or less, and the tunnel leakage current is $10^{-12}$ A/$\mu m^2$ or more at the power voltage of 1.5 V.

A microprocessor 135 is constituted of an IP circuit 138, a cache memory 136 and a CPU 137. Moreover, a control circuit 139 for controlling the active and standby modes is also mounted on the microprocessor 135.

The power source electrode line VDDM of the cache memory 136 is connected to the potential VDDD lower than the power voltage via a P channel type MOS transistor MP200, and is also connected to the power voltage VDD via a P channel type MOS transistor MP201. The gate electrode of the P channel type MOS transistor MP200 is connected to a control signal STBYB0. The gate electrode of the P channel type MOS transistor MP201 is connected to a control signal ACTVB0.

The power source electrode line VDDM of the CPU circuit 137 is connected to the potential VDDD lower than the power voltage via a P channel type MOS transistor MP202, and is also connected to the power voltage VDD via a P channel type MOS transistor MP203. The gate electrode of the P channel type MOS transistor MP202 is connected to a control signal STBYB1. The gate electrode of the P channel type MOS transistor MP203 is connected to a control signal ACTVB1.

The power source electrode line VDDM of the IP circuit 138 is connected to the potential VDDD lower than the power voltage via a P channel type MOS transistor MP204, and is also connected to the power voltage VDD via a P channel type MOS transistor MP205. The gate electrode of the P channel type MOS transistor MP204 is connected to a control signal STBYB2. The gate electrode of the P channel type MOS transistor MP205 is connected to a control signal ACTVB2.

When the control signal STBYB0 indicates "L", and ACTVB0 indicates "H", the cache memory 136 is brought into the standby mode, and the potential of VDDM becomes the voltage VDDD lower than the power voltage, for example, 1.0 V. In this case, the voltage supplied between the gate and source of the MOS transistor drops, and thereby the gate tunnel leakage current is reduced. Additionally, the data in the cache memory is retained without being destroyed.

When the control signal STBYB0 indicates "H", and ACTVB0 indicates "L", the cache memory 136 is brought into the active mode, and the potential of VDDM corresponds to the ground potential VDD. In this case, the gate tunnel leakage current of the MOS transistor increases as compared with the standby mode.

When the control signal STBYB1 indicates "L", and ACTVB1 indicates "H", the CPU circuit 137 is brought into the standby mode, and the potential of VDDM becomes the voltage VDDD lower than the power voltage, for example, 1.0 V. In this case, the voltage supplied between the gate and source of the MOS transistor drops, and thereby the gate tunnel leakage current is reduced. Additionally, the data in the register file and latch are retained without being destroyed.

When the control signal STBYB1 indicates "H", and ACTVB1 indicates "L", the CPU circuit 137 is brought into the active mode, and the potential of VDDM corresponds to the power voltage VDD. In this case, the gate tunnel leakage current of the MOS transistor increases as compared with the standby mode.

When the control signal STBYB2 indicates "L", and ACTVB2 indicates "H", the IP circuit 138 is brought into the standby mode, and the potential of VDDM becomes the voltage VDDD lower than the power voltage, for example, 1.0 V. In this case, the voltage supplied between the gate and source of the MOS transistor drops, and thereby the gate tunnel leakage current is reduced.

When the control signal STBYB2 indicates "H", and ACTVB2 indicates "L", the IP circuit 138 is brought into the active mode, and the potential of VDDM corresponds to the power voltage VDD. In this case, the gate tunnel leakage current of the MOS transistor increases as compared with the standby mode.

<Sixth Embodiment>

Figure 10:
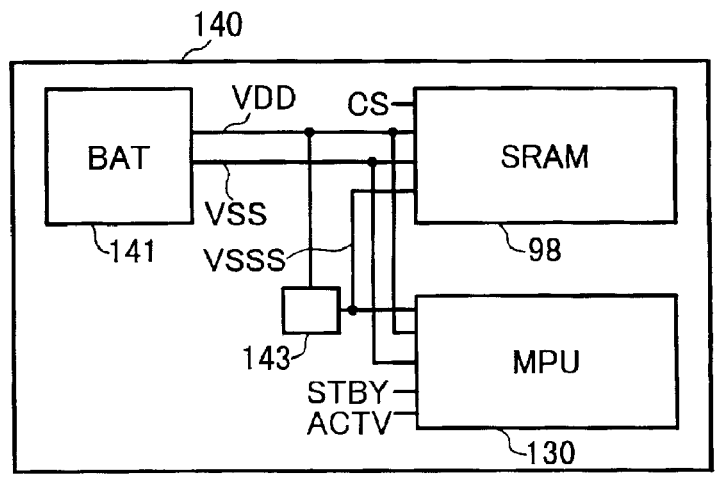
FIG. 10 is a circuit diagram of the semiconductor integrated circuit according to a sixth embodiment.

FIG. 10 shows an embodiment in which the SRAM or the microprocessor using the present invention is applied to a system operated by a battery of a cellular phone or the like.

A battery 141, the SRAM described in the third embodiment and the microprocessor 130 described in the fourth embodiment are mounted on a cellular phone 140. A terminal for driving the battery, an SRAM and a microprocessor are mounted on the single semiconductor substrate in the semiconductor device. Moreover, a circuit 143 for generating the voltage VSSS higher than the ground potential, for example, 0.5 V from the power voltage VDD is also mounted.

The SRAM 98 is brought into the standby mode at CS of "L", a ground electrode indicates 0.5 V, and thereby the gate tunnel leakage current is reduced.

The microprocessor 130 is brought into the standby mode, when STBY indicates "H" and ACTV indicates "L". The ground electrode indicates 0.5 V, and thereby the gate tunnel leakage current is reduced. As a result, it is possible to lengthen a battery life.

<Seventh Embodiment>

Figure 11:
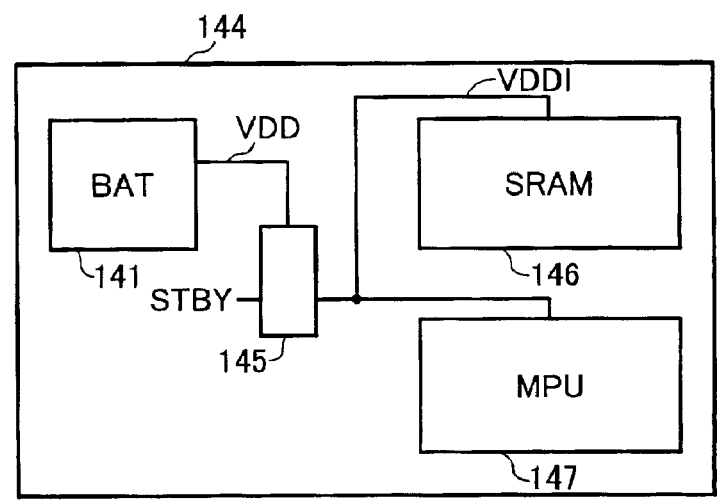
FIG. 11 is a circuit diagram of the semiconductor integrated circuit according to a seventh embodiment.

FIG. 11 shows an embodiment in which the SRAM or the microprocessor according to the present invention is applied to the system operated by the battery of a cellular phone or the like.

A battery 141, an SRAM 146 and a microprocessor 147 are mounted on a cellular phone 144. A power supply chip 145 for supplying a power supply VDDI of the SRAM 146 and the microprocessor 147 is also mounted.

Figure 12:
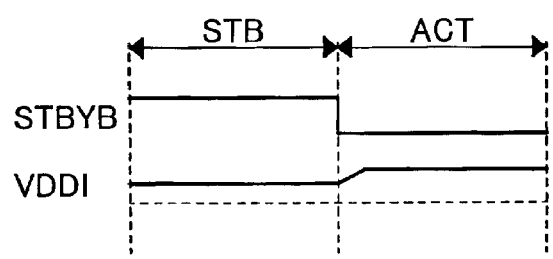
FIG. 12 shows the operating waveform of the semiconductor integrated circuit according to the seventh embodiment.

FIG. 12 shows an operating waveform. In the active mode, a standby signal STBY indicates "L", and the power voltage VDD is supplied to the SRAM 146 and the microprocessor 147.

In the standby mode, the standby signal STBY indicates "H", and the potential lower than the power voltage VDD is supplied to the SRAM 146 and the microprocessor 147. In this case, the gate tunnel leakage current and the GIDL current are reduced. As a result, it is possible to lengthen the battery life.

Additionally, the present invention may be applied to a MIS transistor in which the gate oxide layer of the MOS transistor described above is used as the insulating layer.

According to the present invention, the leakage current can be reduced without destroying data.

It should be further understood by those skilled in the art that the foregoing description has been made on embodiments of the invention and that various changes and modifications may be made in the invention without departing from the spirit of the invention and the scope of the appended claims.

What is claimed is:

1. The semiconductor integrated circuit device comprising:
   a memory mat in which a plurality of static type memory cells are arranged in a matrix;
   a plurality of data lines coupled to said plurality of static type memory cells;
   a plurality of word lines coupled to said plurality of static type memory cells; and
   a source line coupled to source electrodes of P channel type MOS transistors of said plurality of static type memory cells,
   wherein said source line being controlled so that a potential of said source line is set to a first potential in a first condition and is set to a second potential lower than said first potential in a second condition, and
   wherein a substrate potential of said P channel type MOS transistor is said first potential.

2. The semiconductor integrated circuit device according to claim 1,
   wherein said memory cell in said memory mat is selected to perform read or write in said first condition, and
   wherein said memory cell in said memory mat is not selected in said second condition.

3. The semiconductor integrated circuit device according to claim 1, wherein said first condition and said second condition are switched based on a mat selecting signal.

4. The semiconductor integrated circuit device according to claim 1, wherein an insulating layer for use in a gate of said MOS transistor has a thickness of 4 nm or less.

5. The semiconductor integrated circuit device according to claim 1, wherein said plurality of data lines are set to a potential lower than a power voltage in said second condition.

6. The semiconductor integrated circuit device according to claim 1, wherein a GIDL current flowing through said MOS transistor in said second condition is smaller as compared with said GIDL current flowing through said MOS transistor in said first condition.

7. The semiconductor integrated circuit device comprising:
   a memory mat in which a plurality of static type memory cells are arranged in a matrix;
   a plurality of data lines coupled to said plurality of static type memory cells;
   a plurality of word lines coupled to said plurality of static type memory cells; and
   a source line coupled to source electrodes of P channel type MOS transistors of said plurality of static type memory cells,
   wherein said source line being controlled so that a potential of said source line is set to a first potential in a first condition and is set to a second potential lower than said first potential in a second condition, and
   wherein a GIDL current flowing through said MOS transistor in said second condition is smaller as compared with said GIDL current flowing through said MOS transistor in said first condition.

8. A static random access memory device comprising:
   a plurality of memory mats arranged in a matrix, each of which including a plurality of static type memory cells respectively having complementary-type MOS transistors as memory elements;
   a plurality of data lines, through which data is read from or written into the plurality of static type memory cells, respectively connected to each of the plurality of complementary-type MOS transistors;
   a plurality of word lines respectively connected to each of gate electrodes of the plurality of complementary-type MOS transistors in each of the plurality of static type memory cells, an insulating layer for use in each of the gate electrodes having a thickness of 4 nm or less; and
   a source line, connected to sources of each of P-channel type MOS transistors in each of the plurality of complementary-type MOS transistors in each of the plurality of static type memory cells, through which power is supplied to each of the plurality of complementary-type MOS transistors,
   wherein a potential of the source line is controlled to be switched between a first value and a second value which is lower than the first value,
   wherein a substrate potential of said P-channel type MOS transistors is the first value, and
   wherein a GIDL current flowing through each of the plurality of complementary-type MOS transistors under the second value is smaller than a GIDL current flowing through each of the plurality of complementary-type MOS transistors under the first value.

* * * * *